(12) United States Patent
Funakubo et al.

(10) Patent No.: US 7,053,525 B2
(45) Date of Patent: May 30, 2006

(54) ULTRASONIC LINEAR MOTOR

(75) Inventors: Tomoki Funakubo, Hachioji (JP); Yasuo Sasaki, Machida (JP); Kiyoshi Tosaka, Oume (JP); Heiji Ogino, Hachioji (JP); Takashi Kawashima, Hachioji (JP); Toshihiro Nakao, Hachioji (JP)

(73) Assignee: Olympus Corporation, Tokyo (JP)

( * ) Notice: Subject to any disclaimer, the term of this patent is extended or adjusted under 35 U.S.C. 154(b) by 36 days.

(21) Appl. No.: 10/403,129

(22) Filed: Mar. 31, 2003

(65) Prior Publication Data

US 2003/0201695 A1 Oct. 30, 2003

(30) Foreign Application Priority Data

| Apr. 3, 2002 | (JP) | ............................. 2002-101742 |
| Jul. 19, 2002 | (JP) | ............................. 2002-211522 |
| Feb. 20, 2003 | (JP) | ............................. 2002-043082 |

(51) Int. Cl.
*H01L 41/04* (2006.01)

(52) U.S. Cl. ............................................... 310/323.16
(58) Field of Classification Search ........... 310/323.16, 310/323
See application file for complete search history.

(56) References Cited

U.S. PATENT DOCUMENTS

| 4,990,835 | A | * | 2/1991 | Ohnishi et al. | ............. 318/116 |
| 5,200,665 | A | * | 4/1993 | Iijima | .................... 310/323.16 |
| 5,416,375 | A | * | 5/1995 | Funakubo et al. | ..... 310/223.16 |
| 5,783,899 | A | * | 7/1998 | Okazaki | ..................... 310/317 |
| 5,982,075 | A | * | 11/1999 | Hayasaka | .............. 310/323.01 |
| 6,211,603 | B1 | * | 4/2001 | Iino et al. | ............. 310/323.02 |
| 6,242,846 | B1 | * | 6/2001 | Ashizawa et al. | ..... 310/323.02 |

FOREIGN PATENT DOCUMENTS

| JP | 6-105571 | 4/1994 |
| JP | 7-163162 | 6/1995 |
| JP | 9-19172 | 1/1997 |

* cited by examiner

*Primary Examiner*—Darren Schuberg
*Assistant Examiner*—J. Aguirrechea
(74) *Attorney, Agent, or Firm*—Scully, Scott, Murphy & Presser, P.C.

(57) ABSTRACT

An ultrasonic linear motor according to the present invention has a configuration wherein driving elements are glued at portions on faces of an ultrasonic transducer, facing one another, where rotational directions of elliptic vibrations generated on the faces are reverse one to another, a pair of guides are provided for being pressed into against the driving elements so as to hold the ultrasonic transducer therebetween, and leaf springs serving as pressing part are provided so as to narrow a spacing between the one pair of guides, whereby the ultrasonic transducer is configured as an self-moving ultrasonic linear motor which can drive by itself. Thus, driving properties of the ultrasonic transducer itself is improved, and also the size of the ultrasonic linear motor can be reduced.

16 Claims, 18 Drawing Sheets

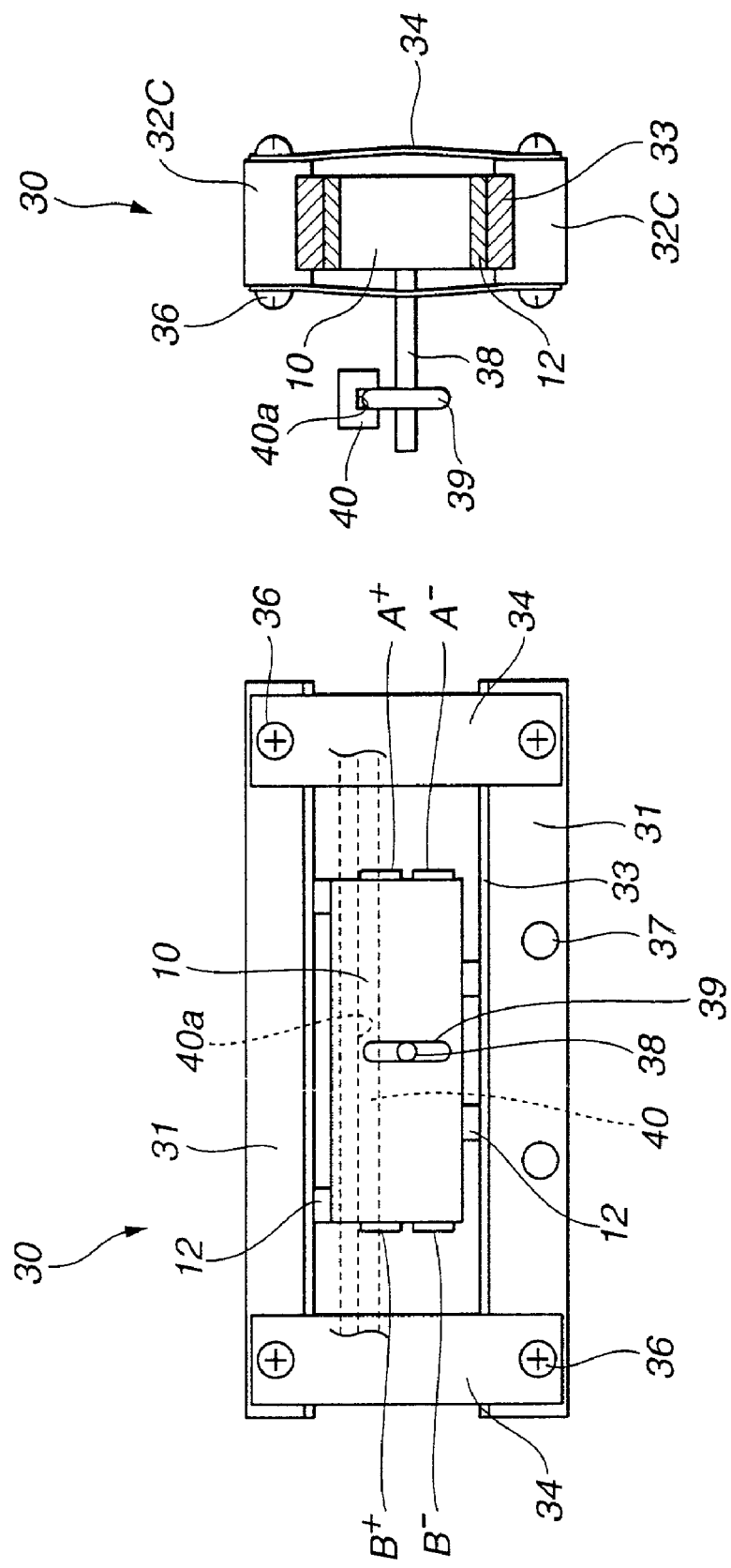

ULTRASONIC LINEAR MOTOR

This application claims benefit of Japanese Application No. 2002-101742 filed in Japan on Apr. 3, 2002, No. 2002-211522 filed in Japan on Jul. 19, 2002, No. 2003-043082 filed in Japan on Feb. 20, 2003, the contents of which are incorporated by this reference.

BACKGROUND OF THE INVENTION

1. Field of the Invention

The present invention relates to an ultrasonic linear motor using an ultrasonic transducer, and particularly to an ultrasonic linear motor with a simple configuration which enables miniaturization thereof.

2. Description of the Related Art

In recent years, ultrasonic motors have received much attention as new motors replacing electromagnetic motors. The ultrasonic motors have the advantages described below as compared with conventional electromagnetic motors.

(1) Low speed and powerful thrust can be obtained without gears.
(2) The retentivity is great.
(3) The stroke is long, and high resolution is obtained.
(4) Excellent quietness.
(5) The linear motor does not generate magnetic noise, and is not affected by noise.

As conventional linear ultrasonic motors having the above-described advantages, an ultrasonic transducer and an ultrasonic linear motor using an ultrasonic transducer proposed by the present assignee, disclosed in Japanese Unexamined Patent Application Publication No. 7-163162, for example, is known. Description will be made below regarding the conventional ultrasonic linear motor proposed in the aforementioned Japanese Unexamined Patent Application Publication No. 7-163162 with reference to the drawings.

FIGS. 18 and 19 are diagrams for describing an example configuration of the conventional ultrasonic linear motor, and FIG. 18 is a disassembled perspective view of the principal components, illustrating the basic components of the ultrasonic transducer used in the ultrasonic linear motor in detail. FIG. 19 is a plan view which illustrates the ultrasonic transducer.

First of all, the configuration of the ultrasonic transducer will be described.

As shown in FIG. 18, a conventional ultrasonic transducer 50 used in the above-described proposed ultrasonic linear motor includes a layered piezoelectric device 50A having a configuration wherein multiple thin piezoelectric sheets 51 in the shape of a rectangle are layered, and piezoelectric sheets 52 and 53 without electrodes as insulators are layered on the top and the bottom of the layers so as to hold the layered piezoelectric sheets 51 therebetween. Furthermore, the layered piezoelectric device 50A has a configuration wherein internal electrodes 54a and internal electrodes 54b are alternately inserted between each piezoelectric sheet.

The internal electrodes 54a and 54b of the piezoelectric sheet 51 are provided on the upper-half region of thereof. While the internal electrodes 54a are formed so as to extend up to the side end portions of the transducer (piezoelectric sheet 51), the internal electrodes 54b are formed so as to extend up to the top face end portion of the transducer (piezoelectric sheet 51).

The piezoelectric sheets 51 and the internal electrodes 54a and 54b are positioned on the green sheet of lead zirconate titanate (which will be referred to as PZT hereafter) by being printed electrodes thereon, and are baked in the layered state, whereby a layered piezoelectric layered device 50A is formed. Note that, with the layered piezoelectric sheets 51, 52, and 53, the internal electrodes 54a are exposed on the side face portions, and also the internal electrodes 54b are exposed on the upper side portion, in the configuration described above.

With the ultrasonic transducer 50 configured using the layered piezoelectric device 50A having the above-described configuration, external electrodes 55 made up of conductors are provided at the positions where the internal electrodes 54a are exposed on both side portions of the layered piezoelectric device 50A, i.e., one each of the left and the right sides serving as grounds (GND), and the positions where the internal electrodes 54b are exposed on the upper portion of the layered piezoelectric device 50A, i.e., two portions on the top face serving as input A and input B, as shown in FIG. 19.

Here, with the ultrasonic transducer 50, the electrode terminal wherein the external electrode 55 is connected to the internal electrodes 54b extended from the left side of the upper face portion of the layered piezoelectric device 50A will be called as A (input A), the electrode terminal wherein the external electrode 55 is connected to the internal electrodes 54b extended from the right side of the upper face portion of the layered piezoelectric device 50A will be called as B (input B), and the electrodes 55 disposed on both side face portions of the ultrasonic transducer 50 are grounds (GND).

Furthermore, leads are each connected to the external electrodes 55 with solder or the like, which is not shown in the drawings, and these leads are connected to an unshown driving circuit for the piezoelectric sheets 51.

Protruding driving elements 56 are also provided at predetermined positions on the bottom face of the layered piezoelectric device 50A, and are pressed into contact against an unshown driven member for sliding (moving with friction) the driven member. The driving elements 56 are provided at arbitrary positions where the ultrasonic transducer 50 performs elliptic vibration.

Furthermore, a small through hole is provided at the center portion of the ultrasonic transducer 50, and a pin 57 is mounted through the through hole.

In order to configure and operate an ultrasonic linear motor using the ultrasonic transducer 50 having the above-described configuration, pressing means for engaging the pin 57 and pressing the driving elements 56 in the lower direction in the drawing, and a driven member which is pressed into contact against the driving elements 56 of the ultrasonic transducer 50, are provided so as to be relatively moved to the driving elements 56, whereby the ultrasonic linear motor is configured.

Note that the driven member is held by a linear guide, which is not shown in the drawings, and can be linearly moved by being pressed into contact against the driving elements 56 and being guided by the linear guide.

Next, operations of the above-described ultrasonic transducer 50 will be described.

With the ultrasonic linear motor using the ultrasonic transducer having the above-described configuration, a direct current voltage (DC voltage) is applied to the external electrode 55 through unshown leads so that polarization is effected.

Furthermore, upon applying AC voltages (with frequency which is the resonance frequency for the ultrasonic transducer 50), wherein the phase of one AC voltage is different from another by $\pi/2$, to the above-described input A and input B, first longitudinal vibration and second flexural vibration are generated at the portions of the driving elements 56, thereby enabling clockwise or counterclockwise ultrasonic elliptic vibrations to be generated. At this time, due to generating of the ultrasonic elliptic vibration, the driven member which is pressed into contact against the driving elements 56 can be driven in the right direction or the left direction, and thus the arrangement can serve as an ultrasonic linear motor.

On the other hand, a linear ultrasonic actuator disclosed in Japanese Unexamined Patent Application Publication No. 9-19172 is another known example of conventional art. The proposed linear ultrasonic actuator will be described with reference to FIG. 20.

FIG. 20 is a disassembled perspective view which illustrates a schematic configuration of the proposed conventional linear ultrasonic actuator.

As shown in FIG. 20, a linear ultrasonic actuator 60 of the present example comprises a base 61, a frame member 62, side plates 63, guide members 65, top face plates 66, a transducer 68, elastic members 69, movable rails 70, a table 71, mats 72, double-faced adhesive tapes 73, and so forth.

The transducer 68 is vertically held between a pair of elastic members 69, and is positioned on the base 61 through a seat plate (not shown), and electrodes connected to high frequency electrodes are formed on the top face and bottom faces thereof, which is not shown in the drawings. Furthermore, a collar having a flange-shaped portion on the upper portion thereof is inserted into the transducer 68, the elastic members 69, the seat plate (not shown), and the center hole of the base 61, and a stopper is mounted at the bottom end thereof, so that the base 61, the seat plate, the elastic members 69, and the transducer 68 are held between the flange-shaped portion and the base 61, which is not shown in the drawings.

A pair of the movable rails 70, which are pressed into contact against the circumference face of the transducer 68 so as to narrow the spacing thereof, and which have V-shaped grooves (not shown) extending in the entire longitudinal direction on one side thereof, are moved in the direction of A and B shown by arrows in the drawing upon applying a high-frequency voltage to the transducer 68. The table 71 connecting the one pair of movable rails 70 is mounted to the movable rails 70 with the double-faced adhesive tapes 73, with a mat 72 made up of a elastic member introduced therebetween.

The above-described configuration aims to provide a linear ultrasonic actuator wherein stable linear actions can be obtained.

OBJECTS AND SUMMARY OF THE INVENTION

In brief, an ultrasonic linear motor according to the present invention comprises first and second guides for providing pressing force, and an ultrasonic transducer including piezoelectric units provided to at least two portions, a plurality of first contact portions having portions for receiving the pressing force from the first guide, and at least one second contact portion having portions for receiving the pressing force from the second guide. Voltages which change over time are applied to the piezoelectric units so as to excite the ultrasonic transducer such that elliptic vibrations are generated at at least one contact portion of the first and second contact portions, whereby the ultrasonic transducer is relatively moved as to the first or second guide.

These objects and advantages of the present invention will become further apparent from the following detailed explanation.

BRIEF DESCRIPTION OF THE DRAWINGS

FIG. 7A is a plan view of an ultrasonic linear motor, which illustrates another modification of the structure of the guide casing of the ultrasonic linear motor;

FIG. 7B is a side view of the ultrasonic linear motor shown in FIG. 7A;

DETAILED DESCRIPTION OF THE PREFERRED EMBODIMENTS

Figure 1B:
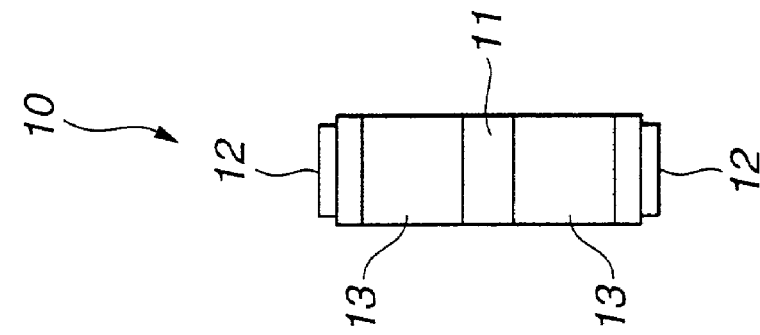
FIG. 1B is a side view of the ultrasonic transducer shown in FIG. 1A.

The embodiments of the present invention will be described below referring to the drawings.

First Embodiment (Configuration)

Figure 1A:
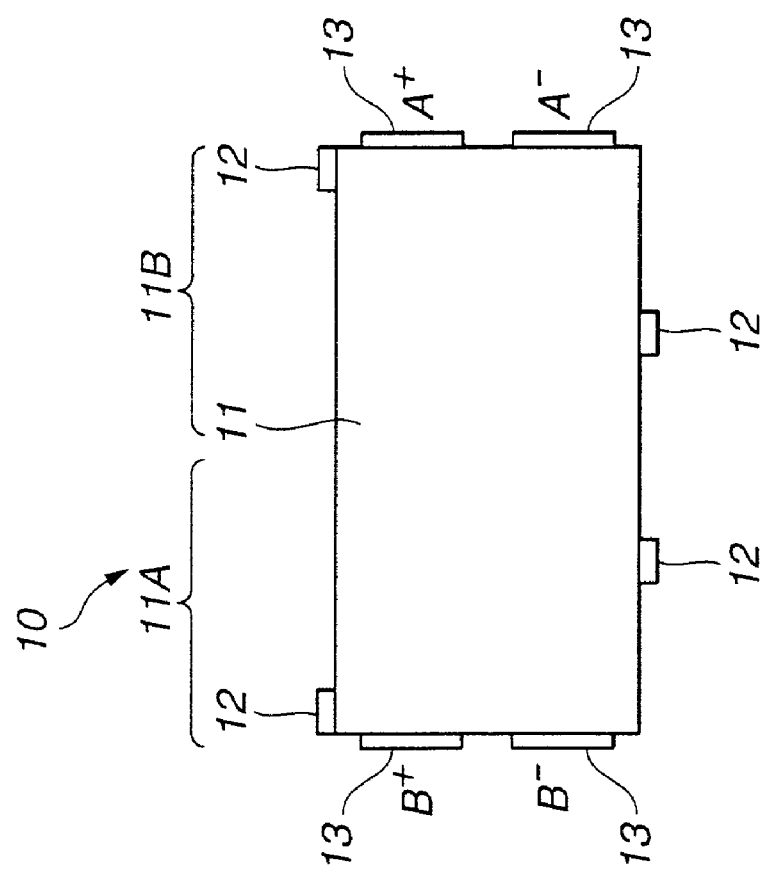
FIG. 1A illustrates an ultrasonic linear motor of a first embodiment according to the present invention, and is a plan view for describing a schematic configuration of an ultrasonic transducer mounted on the ultrasonic linear motor.
Figure 2:
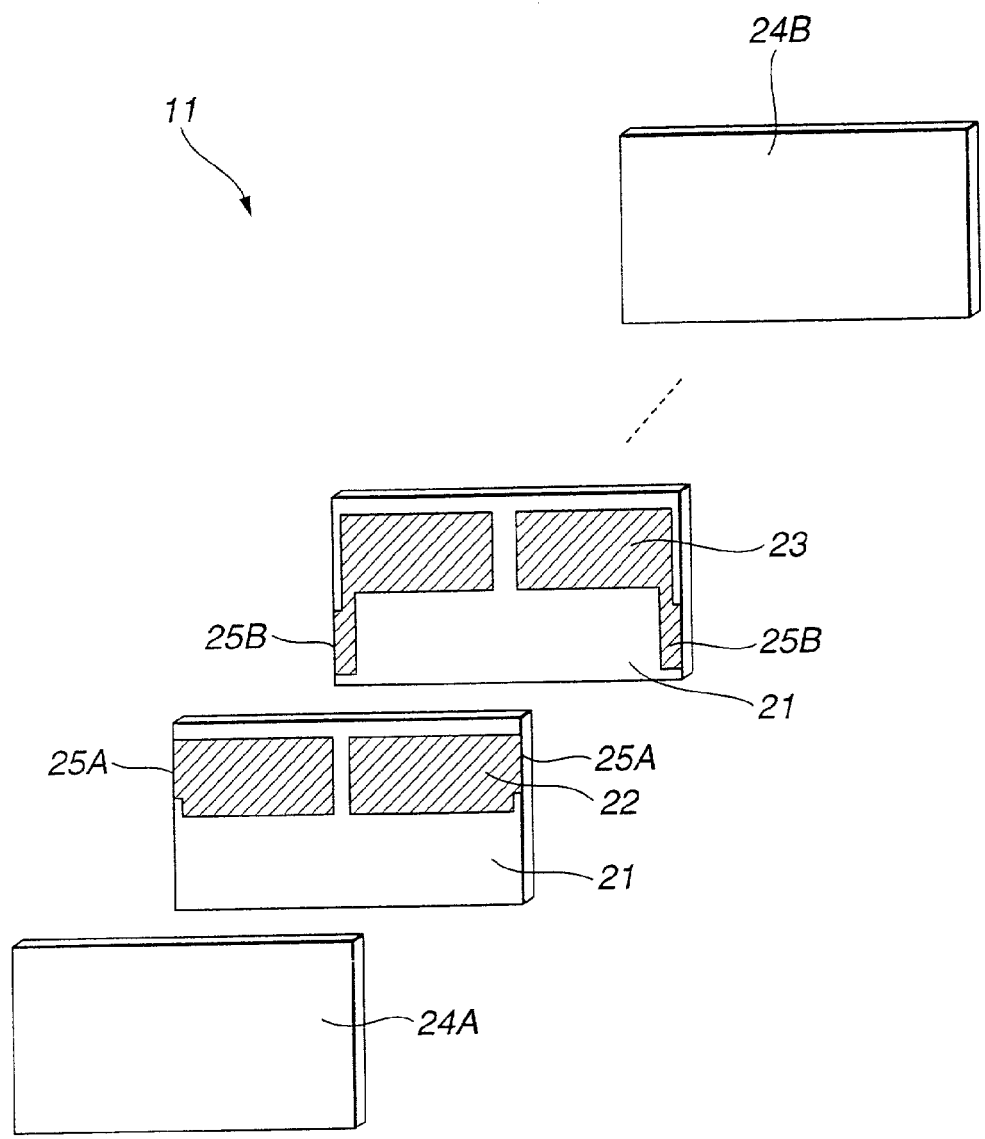
FIG. 2 is a principal component disassembled perspective view which illustrates basic components of the ultrasonic transducer shown in FIG. 1A in detail.
Figure 3A:
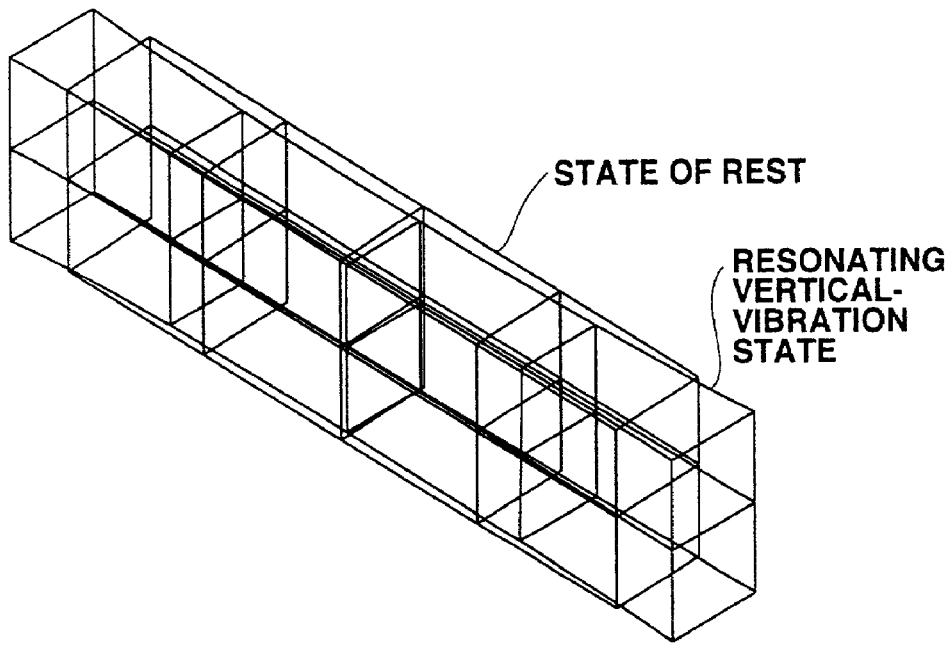
FIG. 3A is a perspective view which illustrates a resonating longitudinal vibration state of the ultrasonic transducer according to the present embodiment.
Figure 3B:
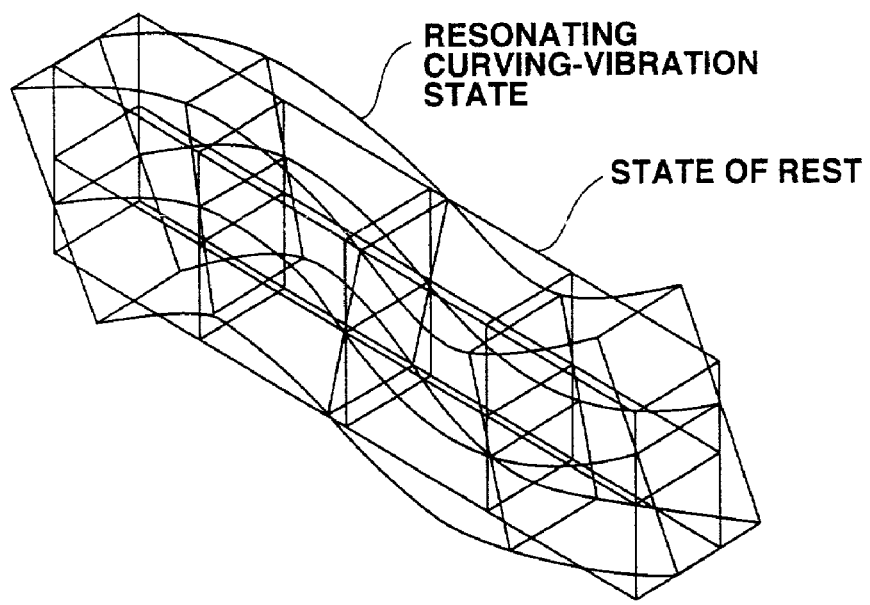
FIG. 3B is a perspective view which illustrates a resonating flexural vibration state of the ultrasonic transducer according to the present embodiment.
Figure 4A:
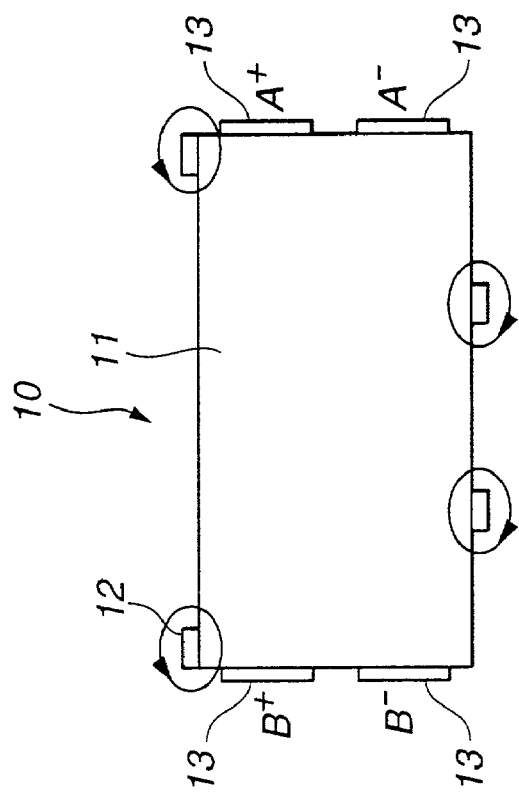
FIG. 4A is an explanatory diagram for describing exciting actions occurring near driving elements of the ultrasonic transducer according to the present embodiment.
Figure 4B:
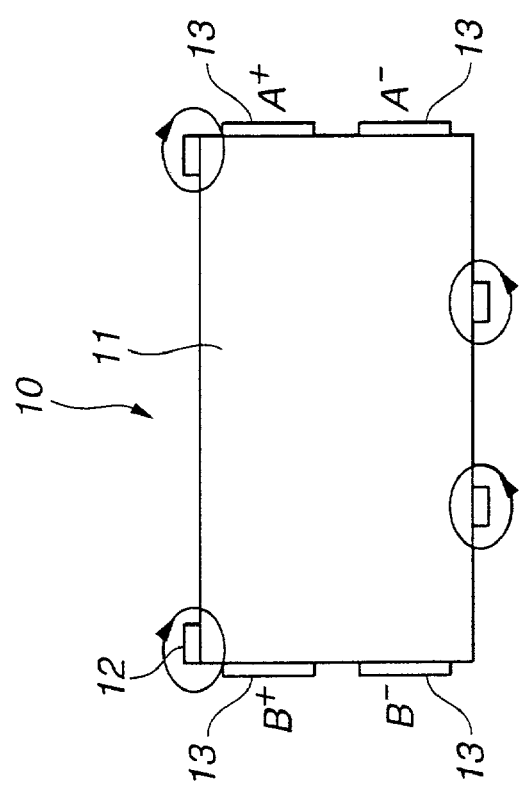
FIG. 4B is an explanatory diagram for describing exciting actions occurring near driving elements of the ultrasonic transducer according to the present embodiment.
Figures 5A, 5B:
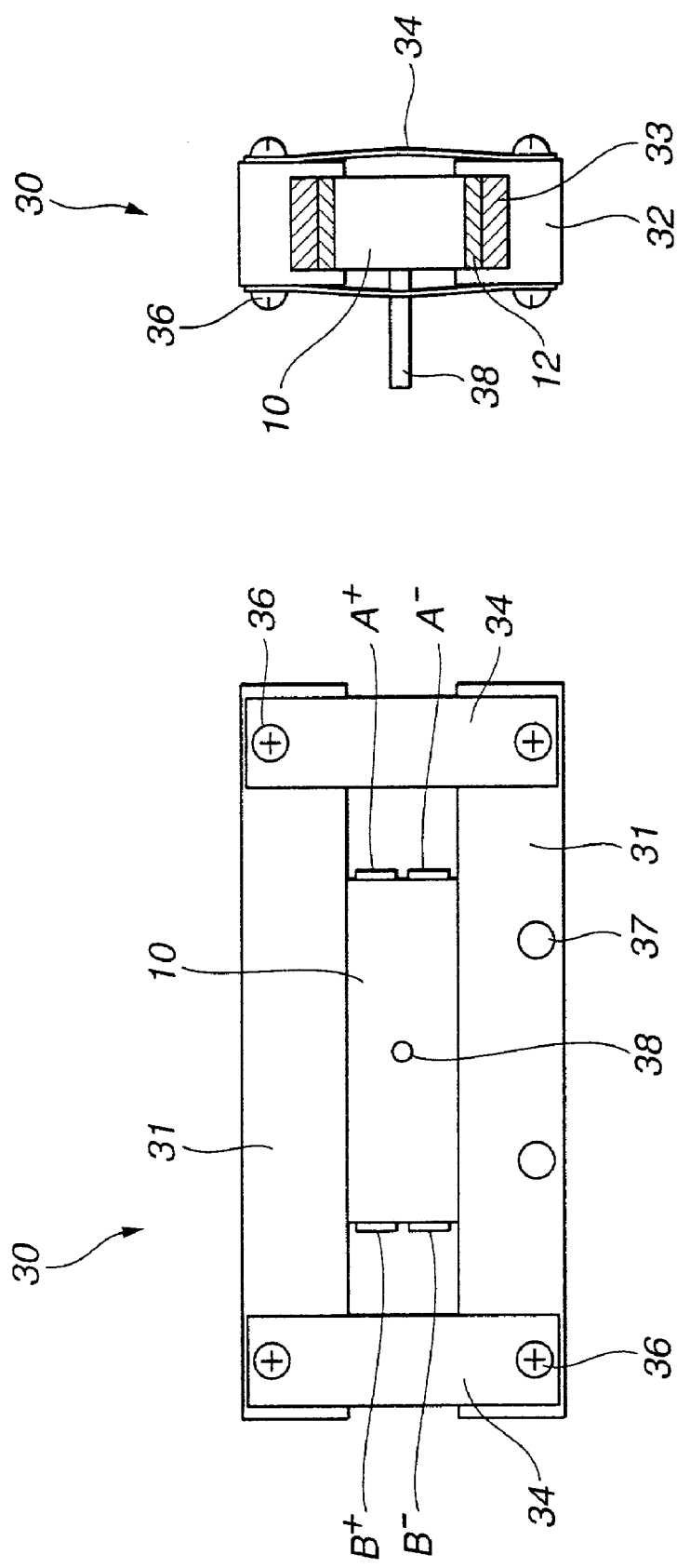
FIG. 5A is a plan view for describing a basic configuration of the ultrasonic linear motor employing the ultrasonic transducer.
FIG. 5B is a side view which illustrates the ultrasonic linear motor shown in FIG. 5A.

FIGS. 1A through 5B illustrate a first embodiment of an ultrasonic linear motor according to the present invention. FIG. 1A is a plan view of an ultrasonic transducer for describing a schematic configuration of an ultrasonic transducer mounted on an ultrasonic linear motor, FIG. 1B is a side view of the ultrasonic transducer shown in FIG. 1A, FIG. 2 is a principal component disassembled perspective view which illustrates basic components of the ultrasonic transducer shown in FIG. 1 in detail, FIG. 3A is a perspective view which illustrates a resonating longitudinal vibration state of the ultrasonic transducer according to the present embodiment, and FIG. 3B is a perspective view which illustrates a resonating flexural vibration state of the ultrasonic transducer according to the present embodiment. Moreover, FIGS. 4A and 4B are explanatory diagrams for describing excitation effects generated near driving elements of the ultrasonic transducer according to the present embodiment. FIG. 4A indicates a case wherein alternate voltage applied to the input A is delayed as compared with the input B by the phase of $\pi/2$. Conversely, FIG. 4B indicates a case wherein alternate voltage applied to the input A is advanced as to that applied to the input B by the phase of $\pi/2$. Moreover, FIG. 5A is a plan view for describing a basic configuration of the ultrasonic linear motor using the ultrasonic transducer, and FIG. 5B is a side view of the ultrasonic linear motor shown in FIG. 5A.

First of all, description will be made in detail regarding the configuration of the ultrasonic transducer mounted to the ultrasonic linear motor according to the present embodiment with reference to FIGS. 1A and 1B.

The ultrasonic linear motor 30 according to the present embodiment has a configuration so as to be self-moving wherein the ultrasonic transducer can be driven by itself for realizing the above-described objects, and comprises a layered ultrasonic transducer 10 as shown in FIGS. 1A and 1B.

As shown in the drawings, the ultrasonic transducer 10 comprises a rectangular parallelepiped piezoelectric layered unit 11, driving elements 12 glued to two portions on each of the bottom face and the top face of the piezoelectric layered unit 11, and external electrodes 13 provided to two portions on both faces of the left side and right side of the piezoelectric layered unit 11.

The piezoelectric layered unit 11 has a configuration, which will be described later in detail, wherein multiple thin rectangular piezoelectric layers 21 on which internal electrodes are formed are layered, and insulator layers 24A and 24B serving as insulators wherein electrodes have not been provided are layered on the top and bottom of the layers so as to hold the multi-layered piezoelectric layers 21 therebetween. The piezoelectric layered unit 11 configures piezoelectric layered portions 11A and 11B, serving as two piezoelectric devices as if it were.

With the side faces of the piezoelectric layered unit 11, two electric terminals (both terminals of A+ and A−) made up of external electrodes 13 connected to internal electrode exposed portions 25A and 25B (see FIG. 2) extended from the right side portion of the piezoelectric layered unit 11 in the drawing will be called A (input A). On the other hand, two electric terminals (both terminals of B+ and B−) made up of the external electrodes 13 connected to the internal electrode exposed portions 25A and 25B (see FIG. 2) extended from the left side portion of the piezoelectric layered unit 11 in the drawing will be called B (input B). In this case, the A− and B− terminals are configured as the grounds (GND) for the phases A and B, respectively, and accordingly an arrangement may be made wherein the A− and B− terminals are connected with a lead so as to hold the same electrical potential.

Detailed description will be further made regarding the configuration of the above-described piezoelectric layered unit 11 with reference to FIG. 2.

The piezoelectric layered unit 11 has a configuration wherein the multiple piezoelectric layers 21 are layered with first internal electrode layers 22 or second internal electrode layers 23 therebetween as shown in FIG. 2.

With the present embodiment, the piezoelectric layer 21 is a piezoelectric device with a width of 10 mm, a height 2.5 mm, and a thickness (thickness in the direction of the layers) of 80 µm, and is made up of PZT (lead zirconate titanate). Note that a hard material with a great Qm value is employed for the PZT material, and in this case, the Qm value is 2000.

Furthermore, the piezoelectric layered unit 11 has a configuration wherein the insulator layers 24A and 24B, which are made up of the same PZT material and have no electrodes, so as to serve as insulators, are layered on the top (the top layer) and the bottom (the bottom layer) of the layers so as to hold the multi-layered piezoelectric layers 21 therebetween.

The insulator layers 24A and 24B are configured with a thickness of 40 μm. The exposed faces of the insulator layers 24A and 24B are not provided with electrodes, and accordingly, the insulator layers are not polarized and are not piezoelectric, thereby essentially having the nature of insulators.

The first internal electrode layers 22 and the second internal electrode layers 23 provided to the piezoelectric layers 21 are made up of silver palladium or silver as an electrode material, and are configured with a thickness of 4 μm. Moreover, the ultrasonic transducer 10 according to the present embodiment has a configuration wherein the piezoelectric layers 21 are layered such that a total of twenty four layers of the first internal electrode layers 22 and the second internal electrode layers 23 are layered. Note that, in this case, the piezoelectric layers 21 are layered such that the first internal electrodes 22 and the second internal electrodes 23 are alternately layered.

That is to say, various members making up the piezoelectric layers 21 of the present embodiment are layered in the order of the insulator layer 24A, the first internal electrode layer 22, a piezoelectric layer 21, the second internal electrode layer 23, a piezoelectric layer 21, and so forth up to a piezoelectric layer 21, the first internal electrode layer 22, a piezoelectric layer 21, the second internal electrode layer 23, and the insulator layer 24B.

Next, description will be made regarding the shape of the internal electrodes.

The first internal electrode layer 22 provided to the piezoelectric layer 21 is provided to the generally upper-half region as to the cross-sectional structure of the piezoelectric layered unit 11 as shown in FIG. 1A, and specifically, the first internal electrode layers 22 are disposed on the upper portion of one entire face of the piezoelectric layer 21 so as to divide the upper region into equal two parts as shown in FIG. 2. Furthermore, portions of the first internal electrode layers 22 are extended up to the side face end portions on both sides of the piezoelectric layer 21 so that the internal electrode exposed portions 25A are each formed.

On the other hand, with the second internal electrode layers 23, the main portions are generally disposed on the upper portion, and the second internal electrode layers 23 are disposed on the upper region of the entire face on one side of the piezoelectric layer 21, generally the same as with the above-described first internal electrodes 22, so as to divide the upper region into equal two parts. Furthermore, portions of the second internal electrode layers 23 are extended up to both side end portions on the lower-half region of the ultrasonic transducer 10 (piezoelectric layered unit 11) so that the internal electrode exposed portions 25B are each formed thereon.

With the configuration of the piezoelectric layered unit 11 described above, the piezoelectric layered unit 11 according to the present embodiment is configured with a width of 10 mm, a height of 2.5 mm, and a depth of 2 mm.

With the ultrasonic transducer 10 which comprises the piezoelectric layered unit 11 having the configuration described above, external electrodes 13 made up of printed silver are each provided to the internal electrode exposed portions 25A and 25B formed by portions of the first internal electrodes 22 and the second internal electrodes 23 of the piezoelectric layered unit 11 being extended to both side face end portions of the ultrasonic transducer 10 as shown in FIGS. 1A and 1B.

Unshown leads are each connected to the external electrodes 13 with solder or the like, and the leads are connected to an unshown driving circuit for the piezoelectric layered unit 11.

While description has been made regarding an arrangement wherein piezoelectric layered portions 11A and 11B are formed in a transducer as piezoelectric devices for generating vibration (longitudinal/flexural vibrations in the example), an arrangement may be made wherein an elastic member includes a layered piezoelectric device as shown in FIG. 1 in Japanese Unexamined Patent Application Publication No. 06-105571. The above-described layered piezoelectric device can be driven by a low voltage, and thus has the advantage of reduction in the overall size of an apparatus including a power source. It is needless to say that an arrangement may be made wherein a single-plate piezoelectric device is mounted on the same position so as to generate the aforementioned vibrations in the event that reduction of the size is not required by reason of driving power being externally supplied, or the like.

While the piezoelectric portions are formed at two portions in the present embodiment, the piezoelectric portions are not restricted to be formed at two portions, and an arrangement may be made wherein the piezoelectric portions are formed at three or more portions, which can generate longitudinal-flexural vibrations, as shown in FIG. 8 (second embodiment) in Japanese Unexamined Patent Application Publication No. 07-163162. The positioning of the piezoelectric portions and the phase of the applied alternate voltage for generating longitudinal/flexural vibration are described in Japanese Unexamined Patent Application Publication No. 07-163162.

Multiple protruding driving elements 12 are provided at predetermined positions on the bottom face and the top face of the piezoelectric layered unit 11 for being pressed into contact against a sliding plate 33 (see FIG. 5B) of a guide casing 32 and moving with friction, or sliding, on the sliding plate 33.

The driving elements 12 are preferably provided at arbitrary positions where highest-level output properties can be obtained with a configuration of an ultrasonic linear motor using the ultrasonic transducer 10, that is to say, the positions of the ultrasonic transducer 10 wherein the highest-level ultrasonic elliptic vibrations are generated. In general, elliptic vibration effects driving, and accordingly, the driving elements are disposed such that at least one driving element generates elliptic vibration, and the total of driving force due to the vibrations generated at all driving element positions does not become zero.

Note that with the multiple driving elements 12, the driving elements pressed into contact against the first guide will be referred to as first driving elements, and the driving elements pressed into contact against the second guide will be referred to as second driving elements. The first and second guides each comprise contact portions.

With the ultrasonic transducer 10 shown in FIG. 1A, the aforementioned driving elements 12 are preferably pressed into contact against unshown driven members (sliding plates 22) at positions where the greatest flexural vibration is generated, and the maximal value can be obtained, i.e., the center portion of flexural vibration. Specifically, as a result of measurement, the positions are situated at the end portion of the ultrasonic transducer 10, and a position approximately 3 mm from the end portion of the ultrasonic transducer 10.

It has been confirmed that upon applying electric signals under conditions described later in the description of operation, while elliptic vibrations with the same direction are generated at all end portions of the transducer 10, elliptic vibrations are generated on the left side and the right side on the same face in the opposite phases to another, and also, elliptic vibrations are generated on the top and the bottom on the same side in the opposite phases to another. It has been also confirmed that with the portions 3 mm from the end portions, vibrations are generated in a direction reverse of that of the vibrations generated at the end portion, in the opposite phases to another on the left and right side on the same face, and in the opposite phases to another on the top and bottom on the same face.

Accordingly, upon mounting transducers on the same face such that elliptic vibrations with the same-direction are generated, and on a different face such that vibrations with a different direction are generated, all the driving elements contribute to driving, and thus the greatest efficiency can be obtained. However, in order to hold the driving elements with well-balanced so as not to generate torque, both conditions described above are not required. For example, only the one condition that the driving elements are disposed on at least one face such that elliptic vibrations are generated with the same direction, can improve the efficiency.

Furthermore, with the ultrasonic transducer 10, the driving elements 12 having contact portions for being pressed into contact against the first and the second guides are required. With the present embodiment, referring to the results described above, two driving elements 12 are glued at positions 3 mm from both end portions on the bottom face of the ultrasonic transducer 10, and also, two driving elements 12 are glued at both side end portions on the top face thereof as shown in FIGS. 1A and 1B. While the driving elements 12 are glued in the drawings, it is needless to say that an arrangement may be made wherein the driving elements are integrally formed on a different member.

Note that the number of the driving elements 12 for one guide is not restricted to two, and three or more driving elements may be provided. Moreover, an arrangement may be made wherein only one driving element 12 is provided for one guide, but in this case, there is the need for two or more driving elements 12 to be provided for the other guide. Due to the two or more driving elements 12 being at intervals, the transducer 10 does not rotate when moving along the guide, and thus additional structure such as a rotation stopper is not required. Note that there is the need to determine the positioning of the driving elements 12 so as not to generate torque due to pressing force. With the present embodiment, even if one driving element 12 is removed from the bottom face, the conditions are still satisfied. However, in the event of removing one driving element 12 from the top face, torque is generated due to pressing, so the transducer 10 is inclined, and consequently, might not be able to be driven. That is to say, none of the driving elements are positioned between two driving elements on the other side with regard to the movement direction of the driving elements relative to the guide.

Figure 21:
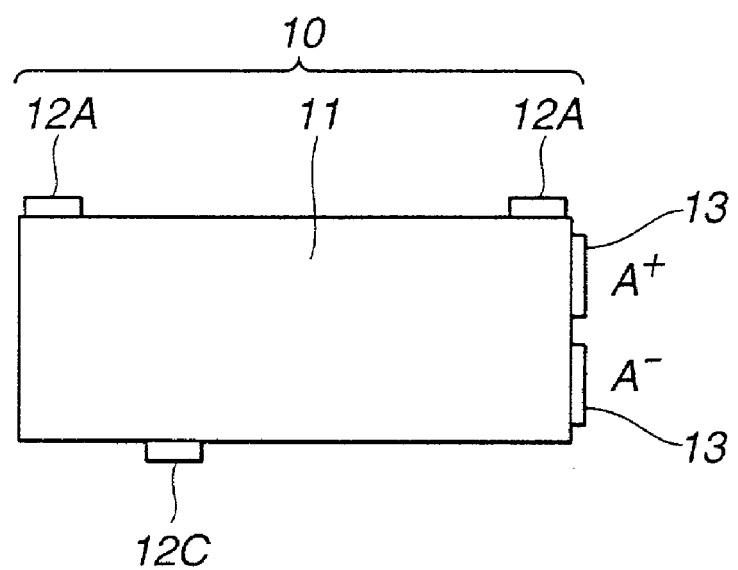
FIG. 21 is a configuration diagram which illustrates a modification of the disposing configuration of driving elements in the ultrasonic linear motor according to the first embodiment.

Thus, in the event of disposing three driving elements as shown in FIG. 21, unnecessary rotation is not generated, and accordingly a rotation stopper is not required, and thus the arrangement has the advantage of reduction in size. A three-driving element transducer has fewer components than a four-driving element transducer, which is advantageous with regard to ease-of-assembly.

With the positioning such as shown in FIG. 21, the driving elements 12A and 12B are pressed into contact against the same guide and move with phases different one from another, and one of the driving elements is displaced toward the guide, thus providing the velocity component in the direction parallel to the sliding plate, whereby driving force is generated. At this time, another driving element is displaced away from the guide, and the driving element moving away generates driving force after a half cycle, so driving can be performed twice in one cycle, thereby reducing the non-driving time period, yielding stable driving, and efficiently transmitting driving force.

Moreover, as shown in FIG. 21, the driving elements 12A and 12C are pressed into contact against guides different one from another, and move with phases different one from another, so both driving elements press the guides at the same time, and driving can be performed while pressing the guides with more powerful force, thereby enabling the driving force to be efficiently transmitted.

The driving elements 12 are made up of a material wherein alumina powder is diffused into resin and is fixed, with a size of a width of 1 mm, a height of 0.5 mm, and a depth of 1.8 mm.

Next, description will be made regarding a manufacturing method for the ultrasonic transducer 10 according to the present embodiment.

First of all, description will be made regarding the piezoelectric layered unit 11.

Half-baked PZT powder and binder are mixed into a paste, and cast onto a film using a doctor blade method, whereby green sheets (corresponding to the piezoelectric layers 21) are formed. Following drying, the green sheets are detached from the film.

Next, an electrode material is printed onto first green sheets using a mask having a pattern of the first internal electrode layer 22 (one or several patterns, see FIG. 2). On the other hand, an electrode material is printed onto second green sheets using a mask having a pattern of the second internal electrode layer 23 (see FIG. 2).

The first green sheets and the second green sheets are alternately layered with precise positioning. Subsequently, third green sheets without printed electrodes are layered on the top face and the bottom face of the layers (corresponding to the insulator layers 24A and 24B).

The layered green sheets are baked at around 1200° C. after thermo-compression bonding, and subsequently, cut into a predetermined shape, whereby a piezoelectric device corresponding to the piezoelectric layered unit 11 is produced.

The internal electrode exposed portions 25A and 25B (see FIG. 2) are subjected to silver printing, whereby the external electrodes 13 are formed. Upon applying DC high voltages to the input A and input B of the external electrodes 13, polarization is effected. Thus, the piezoelectric layered unit 11 is fabricated.

Furthermore, the driving elements 12 are glued at predetermined positions as described above with an epoxy adhesive agent.

Finally, lead electric terminals are provided to each external electrode 13 with solder, or by being pressed in contact with a flexible board, which is not shown in the drawings. Thus, the transducer 10 is fabricated.

Description will now be made in detail regarding operations of the above-described ultrasonic transducer 10 with reference to FIGS. 3A, 3B, 4A, and 4B.

Now, let us say that alternating voltages with the same phase and a frequency near 160 kHz are applied to the above-described input A and input B of the ultrasonic transducer 10 shown in FIG. 1. As a result, the ultrasonic transducer 10 is excited with the first longitudinal vibration. On the other hand, upon applying alternating voltages to the above-described input A and input B in the opposite phases to another and a frequency near 160 kHz, the ultrasonic transducer 10 is excited with the second flexural vibration.

As a result of computer analysis of the above-described vibration using a finite element method, a resonating longitudinal-vibration attitude as shown in FIG. 3A, and resonating flexural vibration attitude as shown in FIG. 3B, are predicted. Measurement of ultrasonic vibrations confirms this to be true.

With the present embodiment, the ultrasonic transducer 10 is designed such that the resonating frequency of the second flexural vibration is lower than the resonating frequency of the first longitudinal vibration by several percent (preferably around 3%). With the configuration described above, the output properties as an ultrasonic linear motor described later are markedly improved.

Next, let us say that alternating voltages with phases different one from another by π/2 and a frequency near 160 kHz are applied to the input A and input B of the ultrasonic transducer 10. As a result, elliptic vibrations are observed at the positions of the driving elements 12 of the ultrasonic transducer 10.

In this case, the direction of rotation due to ultrasonic vibrations at the position of the driving element 12 positioned on the bottom face of the layered ultrasonic transducer 10 is reversed to the direction of rotation due to ultrasonic vibration at the position of the driving element 12 glued on the top face.

That is to say, as shown in FIG. 4A, in the event that the phase of an alternate voltage applied to the input A is delayed as to that of the input B by π/2, the driving elements 12 on the bottom face rotate counterclockwise, and conversely, the driving elements 12 on the top face rotate clockwise. As described above, in the event that the driving elements on the same face are disposed so as to rotate in the same direction, driving force can be most efficiently obtained.

On the other hand, as shown in FIG. 4B, in the event that the phase of the alternate voltage applied to the input A is advanced as to that of the input B by π/2, the driving elements 12 on the bottom face rotate clockwise, and conversely, the driving elements 12 on the top face rotate counterclockwise.

Next, description will be made in detail regarding a configuration of the ultrasonic linear motor 30 using the above-described ultrasonic transducer 10 with reference to FIGS. 5A and 5B.

As shown in FIGS. 5A and 5B, the ultrasonic linear motor 30 according to the present embodiment primarily comprises the ultrasonic transducer 10 having the above-described configuration, a pair of guides 31 for holding the ultrasonic transducer, and leaf springs 34, which are provided on both side faces of the aforementioned one pair of guides 31, for pressing the stored ultrasonic transducer 10 and the guides 31 under predetermined pressure.

The guides 31 transmit the force from the pressing members (leaf springs 34 in the present embodiment) to the transducer 10, and also restrict movement of the transducer as to the guides in the direction orthogonal to the contact face between the guide and the transducer. Note that, while description will now be made regarding an arrangement wherein members integrally formed on the guides also restrict the movement in the horizontal direction, an arrangement may be made wherein other separated members restrict the movement in the horizontal direction as described later.

With the present embodiment, while an example will be described wherein motion of the transducer is restricted to a straight direction, an arrangement may be made wherein guides which are gently curved in a vertical and/or horizontal direction are provided so that the transducer moves along the curve.

Thus, as shown in FIG. 5A, the ultrasonic linear motor 30 according to the present embodiment has a configuration wherein two guides 31 are disposed on faces facing the ultrasonic transducer 10 so as to hold the ultrasonic transducer 10 therebetween, and be pressed into contact against the driving elements 12 provided on the faces of the ultrasonic transducer 10, so as to be configured as an self-moving ultrasonic linear motor 30.

As shown in FIG. 5B, the guides 31 for holding the layered ultrasonic transducer 10 therebetween primarily comprise guide casings 32, which have the shape of a box with one end open, and sliding plates 33 glued onto the top and bottom inner faces within the guide casings 32.

The guide casings 32 are made up of aluminum, and the sliding plates 33 are made up of zirconia ceramic.

Moreover, with the present embodiment, leaf springs 34 are provided between the ultrasonic transducer 10 and the sliding plates 33 for providing predetermined pressing force, so as to narrow the distance between the two guides 31.

That is to say, as shown in FIG. 5A, while the leaf springs 34 serve as springs in the vertical direction, the leaf springs 34 serve as fixing members in the horizontal direction, for fixing the two guides 31 on the top and the bottom.

The pressing members are not restricted to leaf springs, rather, an arrangement may be made wherein the pressing members are made up of coil springs, magnets, or the like, which provide force so as to narrow the direction between the first and the second guides. The pressing members are preferably disposed at positions as close to both ends as possible so as to prevent situations wherein the transducer can not be pressed into contact against the guides, or the pressing force is markedly weak, depending on the position.

As shown in FIG. 5A, the two leaf springs 34 are disposed on both side end portions on the top face, and also, the two leaf springs 34 are disposed on both side end portions on the bottom face of the ultrasonic linear motor 30, being fixed to the guide 31 by screws 36.

In reality, the leaf springs 34 are slightly curved in natural conditions, and are adjusted to a shape generally stretched out to the maximum length so as to generate extension force, at the time of fixing the two end portions of the leaf springs 34 to the two guides 31.

Furthermore, the guide 31 on the lower side is provided with multiple openings 37 for mounting and fixing, and is fixed to an unshown base with screws or the like using the openings 37. On the other hand, the guide 31 on the upper side is not fixed to the base (not shown), and is held by only the leaf springs 34.

Accordingly, the guides on the upper and lower sides are not parallel one to another (the interval is somewhat narrow on the non-transducer side), particularly upon the transducer being situated around either of both ends, and consequently, some driving elements might not be pressed into contact against the guides in this state. Providing mechanisms for keeping the relationship of the guides parallel one to another can prevent the above-described phenomenon. However, the phenomenon wherein some of the driving elements temporarily depart from the guide is not a fundamental problem for driving. For example, with the four driving elements 12 as shown in FIG. 1A, upon the transducer being situated around the center of the stroke, all the four driving elements are pressed into contact against the guides. However, upon the transducer being situated at the left end, the driving elements on the bottom-left side come off from the guide somewhat, and also, upon the transducer being situated at the right end, the driving elements on the bottom-right side come off from the guide somewhat. In this case, the driving elements which do not come off from the guides (e.g., bottom-right driving elements at the time of the transducer being situated at the left end) are pressed into contact against the guides, and effect elliptic vibration, whereby the driving elements serve as driving source.

As described above, while the driving elements are members or portions including contact portions, the contact portions should be more correctly considered to be portions which are pressed into contact against the guides for at least at a part of the stroke.

Furthermore, a pin 38 is glued to the center portion of the ultrasonic transducer 10, i.e., the common node of the first longitudinal vibration and the second flexural vibration (the region near the stationary position in both vibration modes), for obtaining the output. Even in the event of employing a different vibration mode or a combination of different vibration modes, providing the pin at the common node of the vibration modes or the position where generated vibration is minimal enables driving force to be transmitted without vibrations being disturbed. The pin 38 serves as driving transmission means for transmitting driving force externally (e.g., to a driving mechanism within an electronic device, or driven members within an apparatus) from the ultrasonic transducer 10 mounted on an electronic device, electric apparatus, or the like.

It is needless to say that there is no need of providing the pin 38 in the event that the ultrasonic transducer 10 engages the driven member with an engaging member on the driven member side.

Next, operations of the above-described linear motor 30 will be described.

Upon applying alternating voltages to the input A and input B with phases different one from another by $\pi/2$ and a frequency of 160 kHz, clockwise or counterclockwise ultrasonic elliptic vibration was measured at positions of the driving elements 12 due to the first longitudinal vibration and the second flexural vibration being excited.

As described above, ultrasonic elliptic vibrations are generated at positions of the driving elements 12 of the ultrasonic transducer 10 so as to drive the ultrasonic transducer 10 itself in the right side and the left side, whereby an self-moving ultrasonic linear motor can be configured.

(Effects)

Accordingly, with the present embodiment, as described above, the ultrasonic linear motor has a simple configuration wherein multiple driving elements 12 are provided on the two faces of the rectangular parallelepiped ultrasonic transducer 10, facing one to another, and both sides are held by the guide 31, so that the ultrasonic transducer 10 can be driven by itself, and thus movable rails and tables for connection to the movable rails, which have been necessary for conventional related art, are not required, which also does away with the need for the space for the parts, thereby enabling the size of the ultrasonic linear motor to be reduced.

Moreover, taking the operation properties with regard to the ultrasonic linear motor into consideration, the ultrasonic linear motor according to the present embodiment has a configuration wherein the multiple driving elements 12 are provided, and the driving elements 12 are pressed into contact against the sliding plate 33 within the guide casing 32 at a suitable pressing pressure so as to slide the sliding plate 33, which is different from an ultrasonic linear motor according to the aforementioned conventional related art, thereby enabling driving force due to ultrasonic elliptic vibrations on the ultrasonic transducer 10 to be sufficiently effected, and thus, the driving properties of the ultrasonic transducer 10 can be stabilized. As a result, operation properties as an ultrasonic linear motor can be improved.

Figure 9:
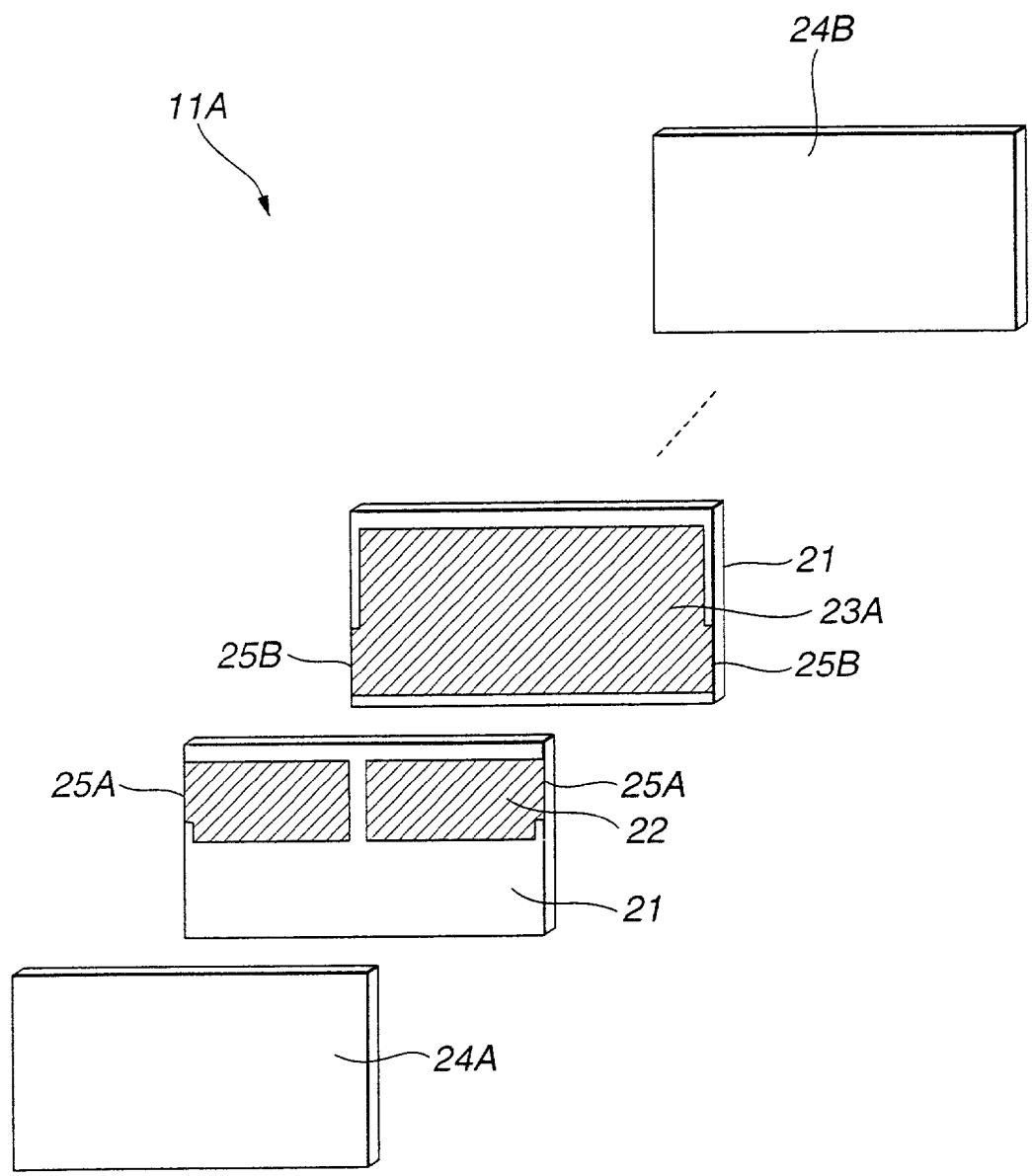
FIG. 9 is a principal component disassembled perspective view which illustrates a modification of the structure of internal electrodes of a piezoelectric layered unit.

Note that with the present embodiment, while description has been made regarding a disposition configuration as shown in FIG. 2 with regard to the configuration of the internal electrodes of the piezoelectric layered unit 11, the present embodiment is not intended to be restricted to the configuration, rather, the piezoelectric layered unit 11A may have a configuration wherein second internal electrode layers 23A are each formed on the entire faces of the piezoelectric layers 21 as shown in FIG. 9, instead of the second internal electrode layers 23 (see FIG. 2). In this case, internal electrode exposed formation portions 25B of the second internal electrode layers 23A are disposed at the lower portions on both sides of the piezoelectric layers 21, and accordingly, the second internal electrode layers 23 can be used as common ground (GND) electrodes for both of the A− terminals and the B− terminals.

Figure 10:
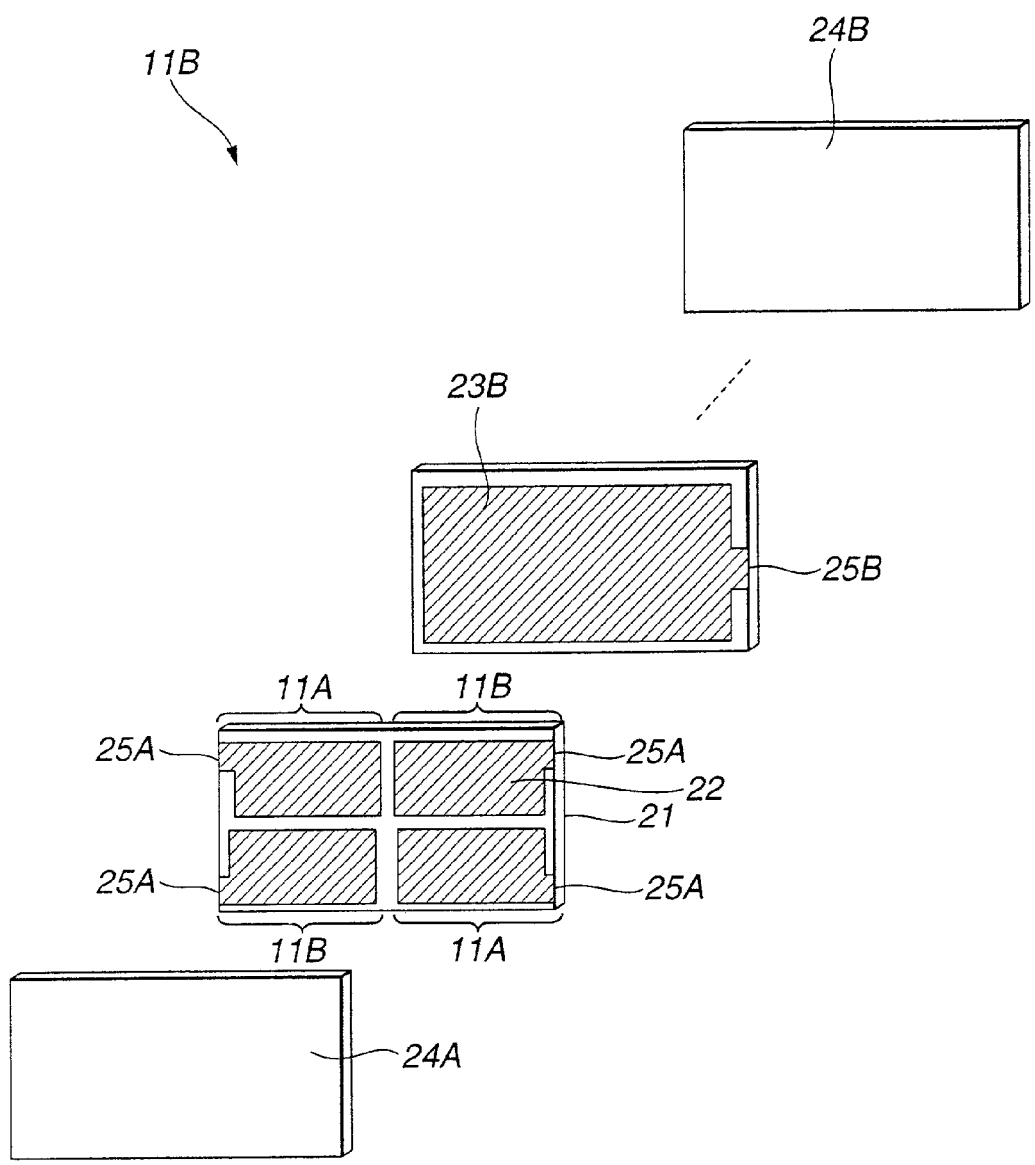
FIG. 10 is a principal component disassembled perspective view which illustrates another modification of the structure of internal electrodes of a piezoelectric layered unit.

Also, as shown in FIG. 10, an arrangement comprising first internal electrodes 22A having the structure wherein the first internal electrodes 22 shown in FIG. 2 are each divided into four equal parts, and second internal electrodes 23B having the structure wherein the second internal electrodes 23 shown in FIG. 2 are each expanded up to the entire faces of the piezoelectric layers 22, may be made. In this case, the internal electrode exposed formation portions 25B of the second internal electrode layer 23 are generally disposed at the center portions on both sides of the piezoelectric layer 21. In the present modification, the internal electrode exposed portions 25A positioned on the top-left side and the bottom-right side in the drawing will be referred to as the input A, and the internal electrode exposed portions 25A positioned on the top-right side and the bottom-left side are referred to as input B. That is to say, the internal electrode exposed portions having the relationship of diagonal positioning therebetween are provided with the same phase alternating voltages with phases different one from another by $\pi/2$ are each applied to the input A and the input B so as to operate the ultrasonic linear motor.

With the present embodiment, while description has been made regarding the driving elements 12 wherein alumina powder is diffused into resin and is fixed, an arrangement may be made wherein the driving elements 12 are made up of alumina ceramic, zirconia ceramic, or the like. Also, with the present embodiment, while description has been made regarding the sliding plate made up of zirconia ceramic, the sliding plate may be made up of alumina ceramic.

Figure 6B:
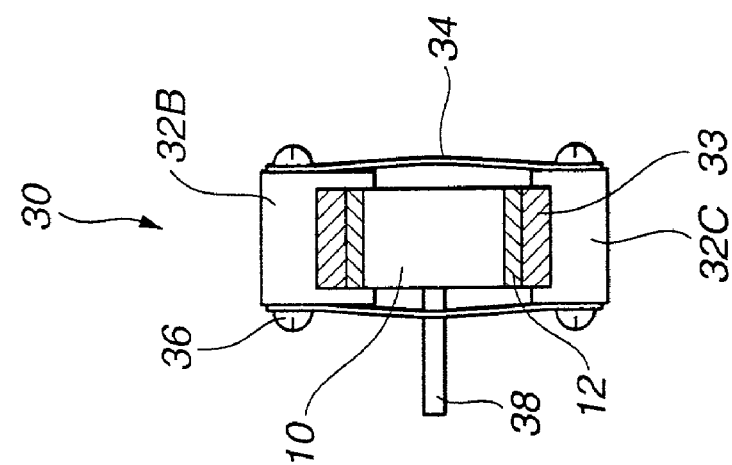
FIG. 6B is a side view of the ultrasonic linear motor shown in FIG. 6A.
Figure 6A:
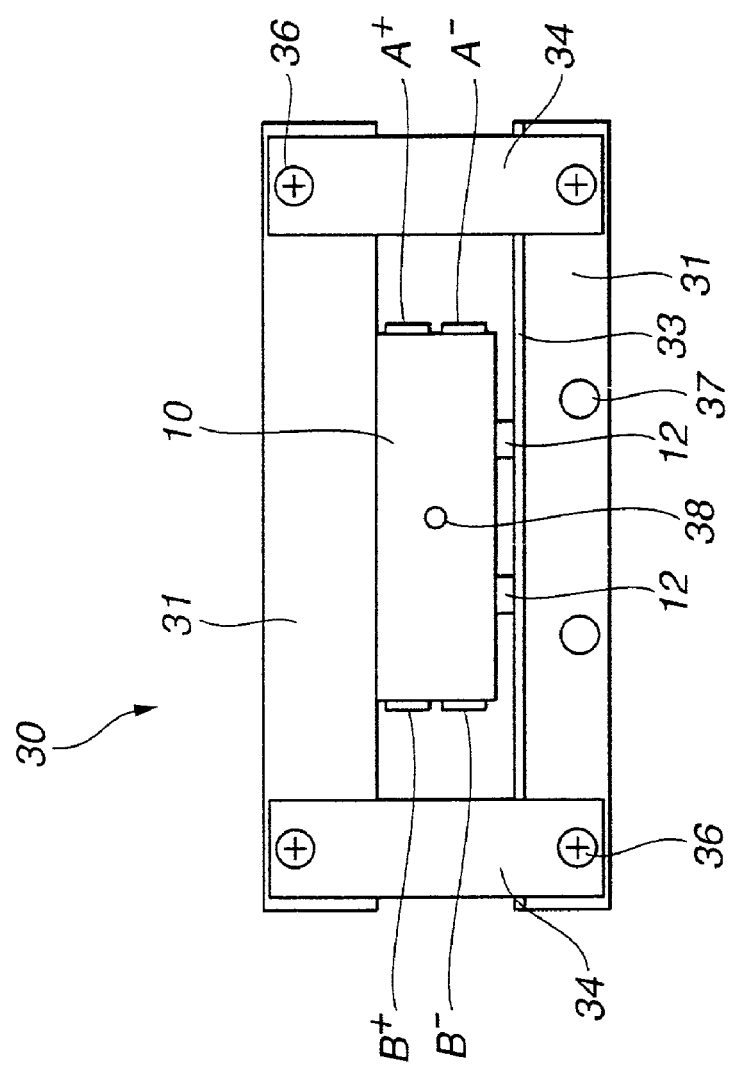
FIG. 6A is a plan view of an ultrasonic linear motor, which illustrates a modification of the structure of a guide casing of the ultrasonic linear motor.

With the present embodiment, in the event that the movement of the transducer must be strictly restricted in the horizontal direction (see FIG. 6B) due to strict linearity of the movement being required, the guide casing 32B strictly restricts the movement of the transducer in the horizontal direction, but on the other hand, the guide casing 32C more preferably does not place restriction as shown in FIG. 6B. In the event that both guides with strict precision in the horizontal direction are provided to both casings, unless manufacturing has been made with the same strict precision, the transducer is pressed into contact against either of the walls of the rails, and consequently, the transducer cannot be moved. Even in the event that the pressing member is configured so as to deform in the horizontal direction, the transducer moves while receiving the reaction against the force for making one guide parallel to another. Accordingly, the transducer might not be able to move depending upon the strength of friction force. On the other hand, as shown in FIG. 6B, providing of the guide for restricting the movement in the horizontal direction to either of the guide casing 32B or the guide casing 32C ensures linear movement of the transducer. Furthermore, there is no need of strict adjustment for making the guides parallel one to another, and yielding the advantage of ease-of-assembly. Note that in the event that strict linear movement is not required, the present embodiment is not restricted to this configuration, and particularly, a configuration wherein both guides has grooves as shown in FIG. 5B also has the advantages of protecting of the driving elements, or and being dustproof.

Figure 22B:
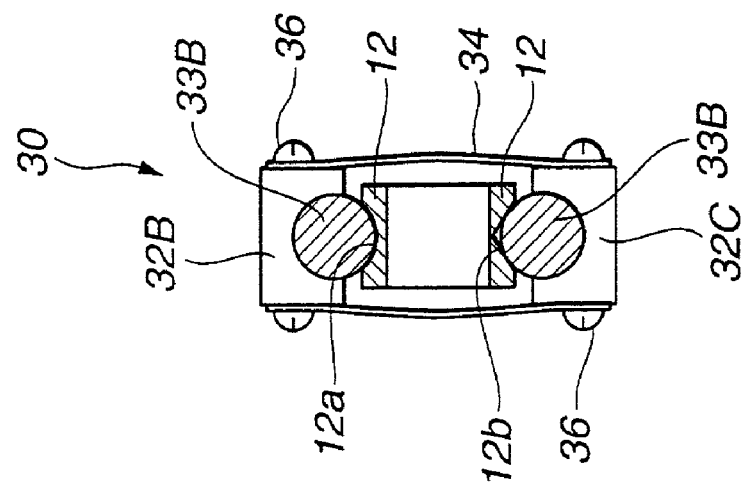
FIG. 22B is a side view of the ultrasonic linear motor shown in FIG. 22A.
Figure 22A:
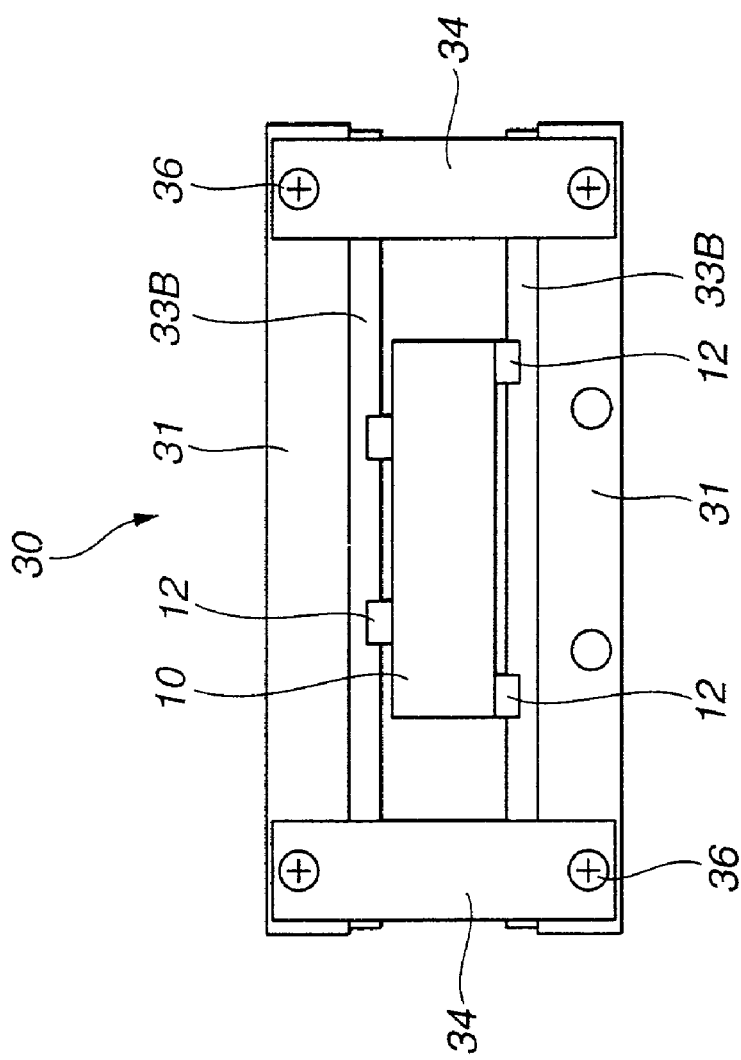
FIG. 22A is a plan view of an ultrasonic linear motor, which illustrates a modification of the structure of a guide casing and the structure of driving elements of the ultrasonic linear motor according to the first embodiment.

Also, conversely to the present embodiment, as shown in FIGS. 22A and 22B, an arrangement may be made wherein the cross-sectional faces around the driving elements 12 (contact portions 12a) are formed in a recessed shape, the sliding portions 33B of the guides 32B and 32C are formed in a protruding shape, the inside portions or the edge portions of the recessed portions are contact portions for being pressed into contact against the protruding sliding portions 33B, and protruding portions on both sides of the recessed portions hold the protruding sliding portions 33 therebetween for guiding, as viewed from the movement direction. That is to say, an arrangement may be made wherein portions of the driving element 12 are the guide structure. With the configuration as described above, there is no need of having independent guides, thereby enabling the size of the ultrasonic linear motor to be further reduced. Note that the aforementioned recessed cross-sectional face of the driving elements 12 (contact portions 12a) may be a circle (arc), V-shape, or the like. The aforementioned protruding cross-sectional face of the sliding portions 33B may be a circle (arc), V-shape, or the like, also. For example, in the event that the cross-sectional face of the protruding sliding portion 33B is in the shape of a circle, and the cross-sectional face around the recessed contact portion 12a is in the V-shape, the driving element 12 are pressed into contact against the sliding portion 33B at two points as viewed in a cross-sectional manner (see FIG. 22B).

Also, with the present embodiment, as shown in FIGS. 7A and 7B, an arrangement may be made wherein the movement of the driving element 12 in the horizontal direction (see FIG. 7B) is restricted by means other than the guides, and the guide casing 32 restricts the movement in the vertical direction.

In this case, as shown in FIG. 7B, the ultrasonic linear motor has a configuration wherein a guide pin 39 is mounted in the direction extending from the pin 38 in the vertical direction, a horizontal-direction-restriction guide unit 40 for guiding the guide pin 39 is provided, and also the guide pin 39 engages a guide groove 40a of the horizontal-direction-restriction guide unit 40 with some play in the vertical direction. With the present embodiment, the guide casing 32 has no mechanisms for restricting the movement in the horizontal direction, thereby enabling the configuration to be made simple. In the event that an apparatus main unit including the ultrasonic linear motor 30 has a guide groove which can be used as a guide groove for the ultrasonic linear motor 30, the size of the ultrasonic linear motor can be further reduced.

Figures 8A, 8B:
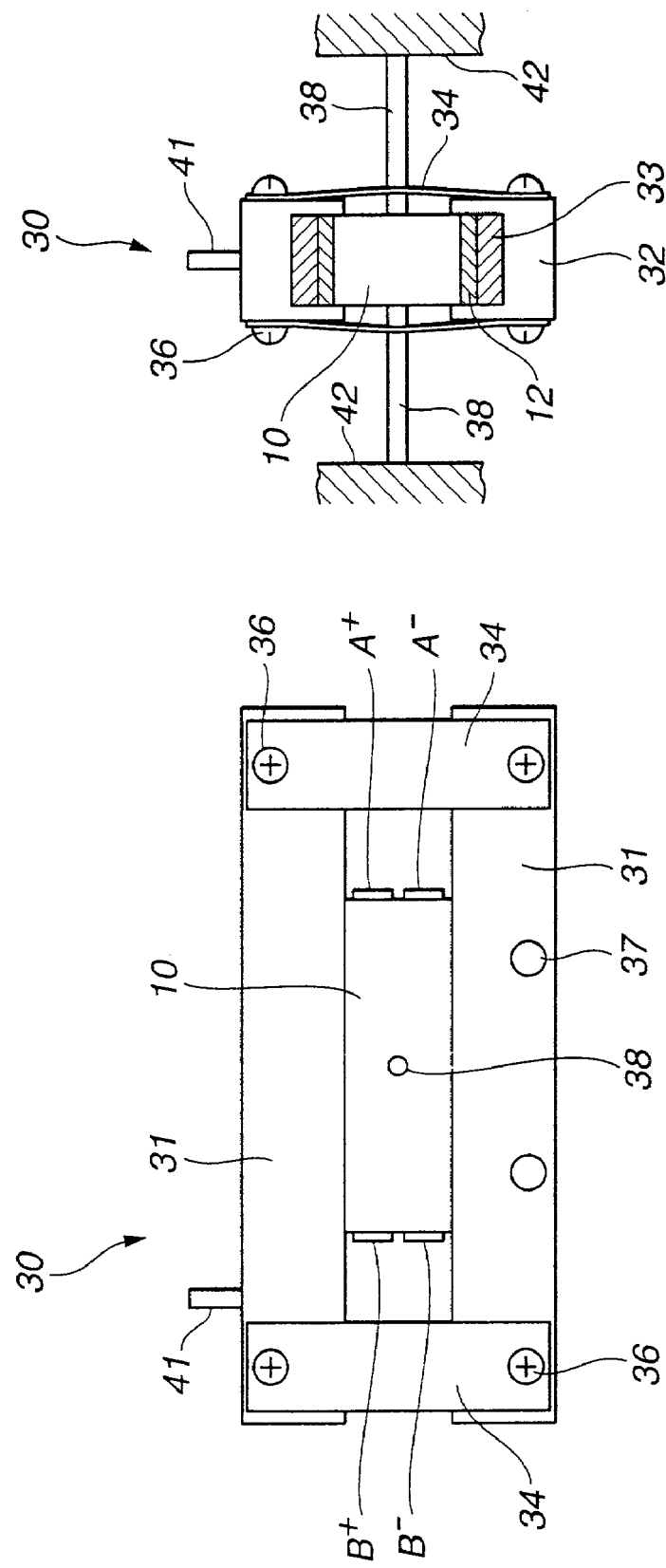
FIG. 8A illustrates a modification of the present embodiment, and is a plan view of an ultrasonic linear motor having a configuration wherein a guide casing is moved.
FIG. 8B is a side view of the ultrasonic linear motor shown in FIG. 8A.

Also, with the present embodiment, an arrangement may be made wherein another pin 38 is also provided on the back face (reverse face) of the ultrasonic linear transducer 10, the end portions of both pins 38 are fixed on the wall face 42 within the mounted member or the like, and a pin 41 is disposed on the guide 31 on the upper side for obtaining the output so as to drive unshown driven members, for example, as shown in FIGS. 8A and 8B. Thus, the ultrasonic linear motor has a configuration wherein the ultrasonic transducer 10 does not move, thereby facilitating wiring or the like for leads.

With the present embodiment, while description has been made wherein the leaf springs 34 are disposed on both end sides as pressing means as shown in FIGS. 5A through 8B, the ultrasonic linear motor is not restricted to the configuration, rather, the structure and number of the pressing means for two guides 31 being pressed into contact against the ultrasonic transducer 10 so as to hold the ultrasonic transducer 10 therebetween, can be optionally determined.

Second Embodiment (Configuration)

Figure 11:
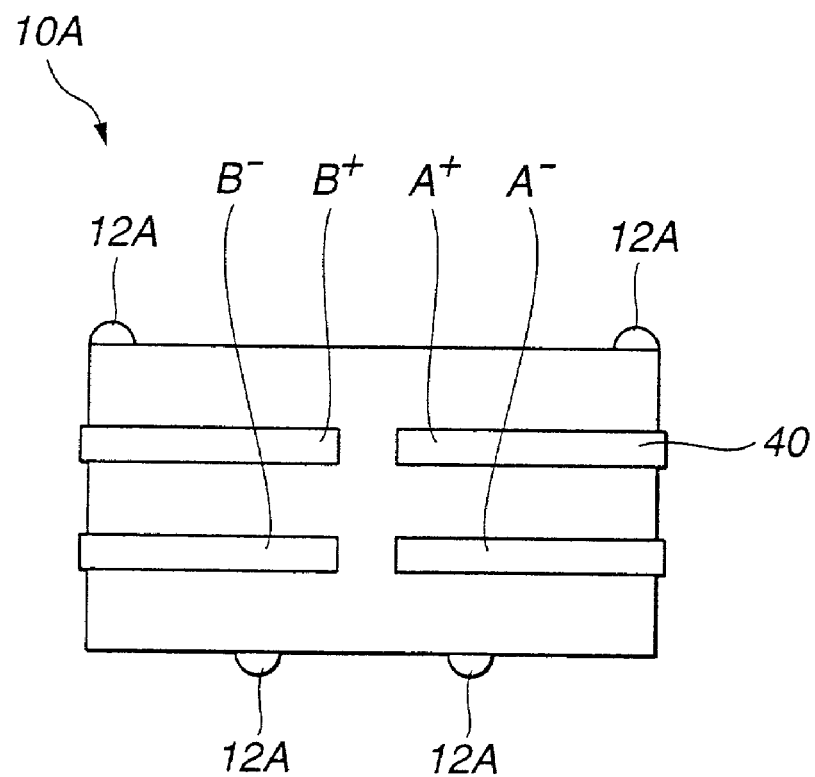
FIG. 11 illustrates an ultrasonic linear motor of a second embodiment according to the present invention, and is a plan view for describing a schematic configuration of an ultrasonic transducer mounted on the ultrasonic linear motor.
Figures 12A, 12B:
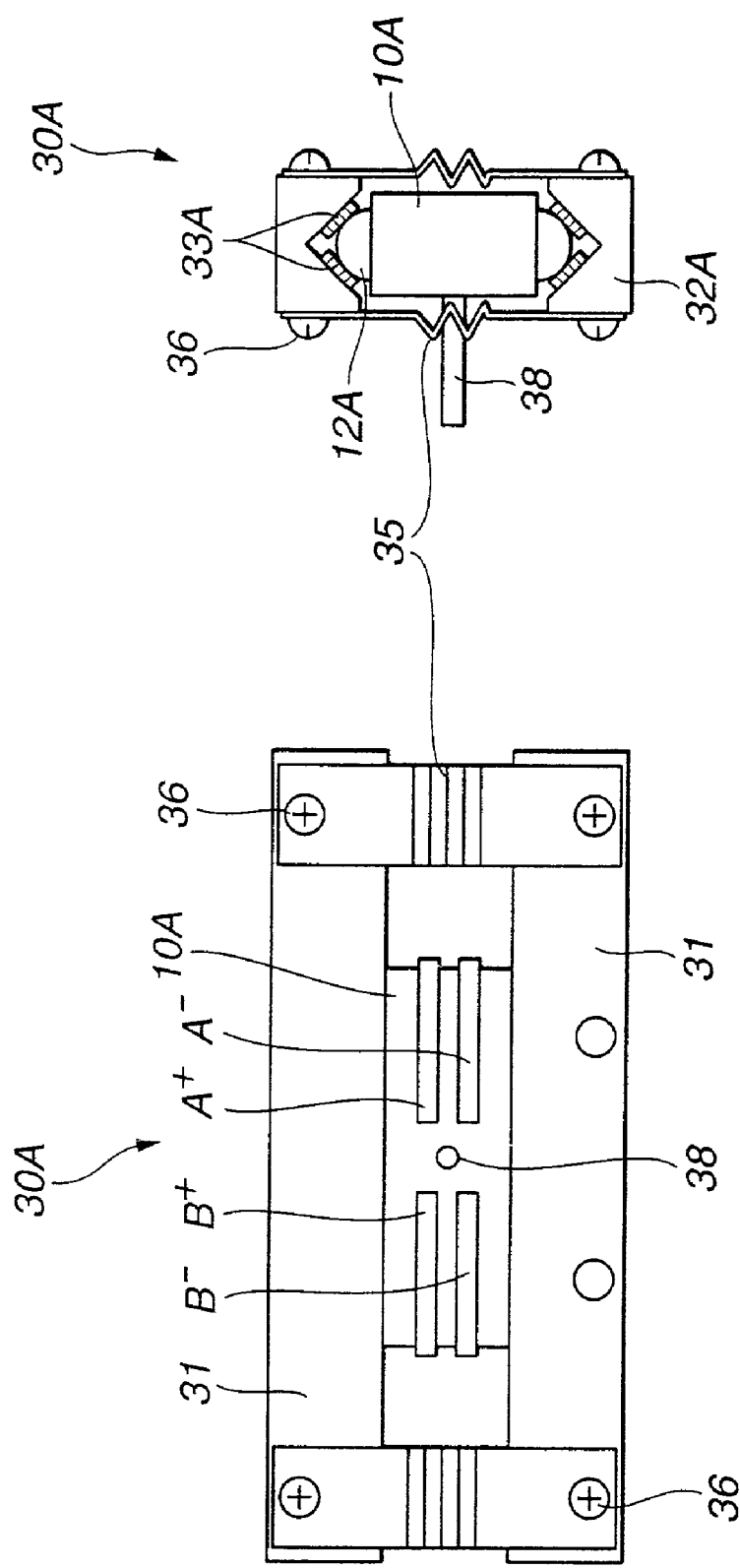
FIG. 12A is a plan view for describing a basic configuration of the ultrasonic linear motor employing the ultrasonic transducer.
FIG. 12B is a side view of the ultrasonic linear motor shown in FIG. 12A.

FIGS. 11 and 12 illustrates a second embodiment of an ultrasonic linear motor according to the present invention. FIG. 11 is a plan view for describing a schematic configuration of an ultrasonic transducer mounted on the ultrasonic linear motor, FIG. 12A is a plan view for describing a basic configuration of the ultrasonic linear motor employing the aforementioned ultrasonic transducer, and FIG. 12B is a side view illustrating the ultrasonic linear motor shown in FIG. 12A. Note that in FIGS. 11, 12A, and 12B, the same components as with the ultrasonic linear motor 30 described in the first embodiment are denoted by the same reference numerals, description will be omitted regarding the same components, and description will be made regarding components different from those of the first embodiment.

With the ultrasonic linear motor 30A according to the present embodiment, the configurations of the ultrasonic transducer and the ultrasonic linear motor according to the above-described first embodiment are improved so as to further improve the connection of leads and driving of the ultrasonic transducer.

Specifically, with an ultrasonic transducer 10A, the structure of the external electrodes and the structure of the driving elements are improved. That is to say, with the first embodiment, the leads for supplying electric power to the ultrasonic transducer 10 are connected to the external electrodes 13 provided at the end portions in the longitudinal direction of the ultrasonic transducer 10. On the other hand, the present embodiment has a configuration wherein leads are connected at portions near the common node of the longitudinal vibration and the flexural vibration of the ultrasonic transducer 10A.

A configuration example of the above-described ultrasonic transducer is shown in FIG. 11. That is to say, as shown in FIG. 11. the present embodiment has a configuration wherein band-shaped external electrodes 40 are provided so as to generally extend up to the center portion of the ultrasonic transducer 10A. Furthermore, the leads are each connected to the end portions of the extending external electrodes 40 with solder or the like.

The shape of the driving elements 12A according to the present embodiment is formed in the shape of a half-sphere so as to improve sliding of the driving elements 12A as to the sliding plate 33A.

FIGS. 12A and 12B illustrate the ultrasonic linear motor 30A of the present embodiment which comprises the ultrasonic transducer 10A having a configuration described above.

As shown in FIGS. 12A and 12B, with the ultrasonic linear motor 10A according to the present embodiment, the shape of the leaf spring and the shape of the guide within the guide casing is different from those in the first embodiment described above. That is to say, the leaf springs 35 have wave-shaped bending portions 35 around the centers thereof for somewhat reducing the spring coefficient. Thus, the spring coefficient of the leaf springs can be somewhat reduced as compared with the above-described first embodiment, thereby enabling adjustment of suitable pressing force of the driving elements 12A to be performed.

The guides 31 have a configuration wherein V-shaped bottom portions are provided to the guide casing 32A, and two sliding plates 33A are each glued to the slopes of the V-shaped portions. The sliding plates 33A are made up of zirconia ceramics, and have a role for smoothly sliding the aforementioned half-sphere driving elements 12A while being pressed into contact thereagainst, and also guiding in the sliding direction in a sure manner.

Other configurations and operations are the same as with the above-described first embodiment, description thereof will be omitted.

(Effects)

Accordingly, the present embodiment has the same advantages as with the above-described first embodiment, and also has additional advantages. That is to say, while with the above-described first embodiment, the positions for extending leads from the external electrodes 40 are restricted, with the present embodiment, the external electrodes 40 are extended from the end portions, and accordingly, wiring configuration can be made freely, thereby facilitating wiring or the like to be performed.

Moreover, acceleration of vibrations is small near the common node of the longitudinal vibration and the flexural vibration, and accordingly, in the event that leads are connected to the portions, problems such as breaking of leads and so forth do not occur.

Furthermore, with a configuration wherein the driving elements of the ultrasonic transducer 30A are formed in the shape of a half-sphere, with each guide having a V-shaped bottom portion, deviation while driving is prevented, and the driving properties of the ultrasonic transducer can be improved, thereby enabling an ultrasonic linear motor suitable for positioning with precision and the like to be realized.

Third Embodiment (Configuration, Operations)

Figure 13:
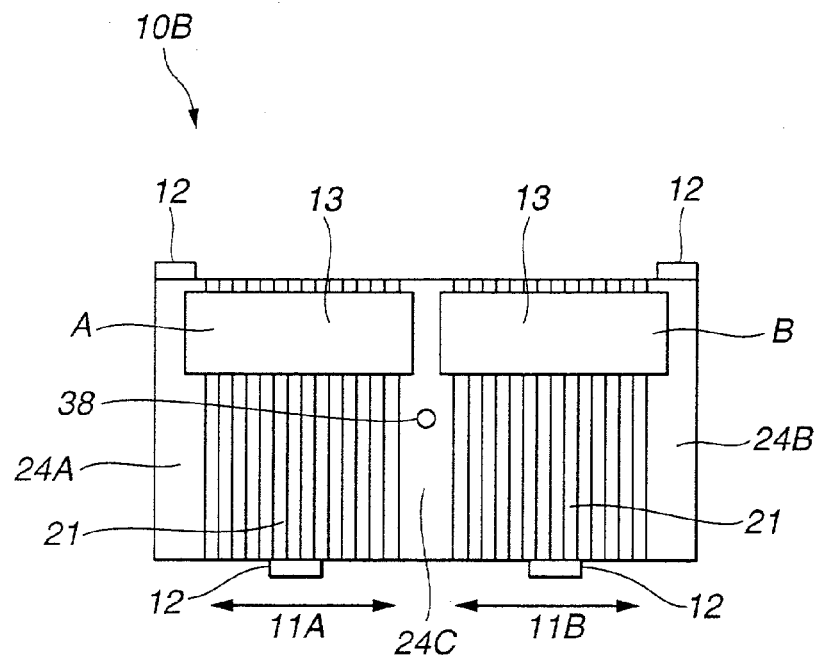
FIG. 13 illustrates an ultrasonic linear motor of a third embodiment according to the present invention, and is a plan view which illustrates a schematic configuration of an ultrasonic transducer mounted on the ultrasonic linear motor.
Figure 14:
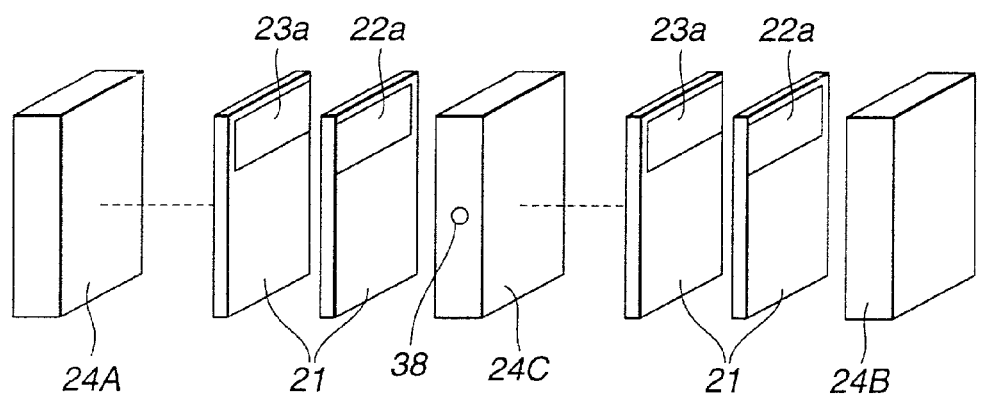
FIG. 14 is a principal component disassembled perspective view which illustrates basic components of the ultrasonic transducer in detail.

FIGS. 13 and 14 illustrates an ultrasonic linear motor of a third embodiment according to the present invention. FIG. 13 is a plan view illustrating a schematic configuration of an ultrasonic transducer mounted on the ultrasonic linear motor, and FIG. 14 is a principal component disassembled perspective view illustrating basic components of the aforementioned ultrasonic transducer in detail. Note that, in FIGS. 13 and 14, the same components as with the ultrasonic linear motor 30 according to the above-described first embodiment are denoted by the same reference numerals, description thereof will be omitted, and description will be made regarding only different components.

While an ultrasonic transducer 10B employed in the ultrasonic linear motor of the present embodiment generally has the same configuration as with the first and second embodiment, the ultrasonic transducer 10B has a different configuration wherein two piezoelectric layered units 11A and 11B made up of rectangular PZT-PMN-type piezoelectric layers 21 subjected to internal electrode process being layered in the driving direction (ultrasonic transducer sliding direction) are provided so as to be situated between three similar rectangular PZT-PMN-type insulator layers 24A, 24B, and 24C, as shown in FIG. 13.

The piezoelectric layer 21 is a piezoelectric device with a height of 10 mm, a depth of 4 mm, and a thickness of 100 μm, a first internal electrode layer 22a is disposed on the upper portion on one side face, and a second internal electrode layer 23a is disposed on the upper portion on the side reverse of the first internal electrode layer 22a, which is not shown in the drawings, respectively.

The aforementioned first internal electrode layer 22a is a film electrode on which a rectangular silver-palladium alloy film with a thickness around 10 μm is coated, and is disposed on one side of the piezoelectric layer 21 so as to have an insulator portion with a width around 1 mm on the side end portion on the back face as viewed from the front in FIG. 13, an insulator portion with a width around 1 mm on the upper end portion, and an insulator portion with a width of around ⅔ of the height of the piezoelectric layer 21 on the lower portion, respectively. On the other hand, the aforementioned second internal electrode layer 23a is disposed on another face of the piezoelectric layer 21, reverse of the aforementioned first internal electrode layer 22a, and is a film electrode on which a rectangular silver-palladium alloy film with a thickness of around 10 μm is coated in the same way. The second internal electrode layer 23a is disposed on the face reverse of the first internal electrode layer 22a so as to have an insulator portion with a width around 1 mm on the side end portion on the front face as viewed from the front in FIG. 13, an insulator portion with a width around 1 mm on the upper end portion, and an insulator portion with a width of around ⅔ of the height of the piezoelectric layer 21 on the lower portion, respectively.

As shown in FIG. 14, the coating positions of the first and second internal electrodes 22a and 23a on one side face and the back face thereof of the aforementioned piezoelectric layers 21 are opposite between piezoelectric layers 21 adjacent one to another. Around one hundred of layers of two types of piezoelectric layers 21 on which above-described first and second internal electrode layers 22a and 23a have been formed are alternately layered, whereby the piezoelectric layered units 11A and 11B according to the present embodiment are configured (see FIG. 13).

On the other hand, the insulator layers 24A, 24B, and 24C are rectangular PZT-PMN-type devices with a height of 10 mm, a depth of 4 mm, and a thickness of 3 mm. The three insulator layers 24A, 24B, and 24C are provided so as to hold the aforementioned two piezoelectric layered units 11A and 11B therebetween, and with the insulator layer 24C situated at the center portion, a through hole 38 with a diameter of 1 mm is provided from the front face up to the back face thereof.

Furthermore, portions of the aforementioned first and second internal electrode layers 22a and 23a are exposed on the upper portions of the front face and the back face of the piezoelectric layered units 11A and 11B of the ultrasonic transducer 10B, whereby four exposed portion groups (not shown) are formed. The four exposed portion groups are provided with four external electrodes 13, respectively, independent one from another, generally the same as with the above-described embodiments, so as to be connected to the first internal electrode layers 22a or the second internal electrode layers 23a.

Other configurations and operations are the same as the above-described first embodiment, so description thereof will be omitted.

(Effects)

Accordingly, the present embodiment has the same advantages as with the above-described first embodiment, and also has the advantage of option in design of the ultrasonic transducer 10B increasing in manufacturing of the ultrasonic transducer 10B due to the configuration wherein the piezoelectric layers 21 are layered in the sliding direction of the ultrasonic transducer 10B.

Fourth Embodiment (Configuration)

Figure 15:
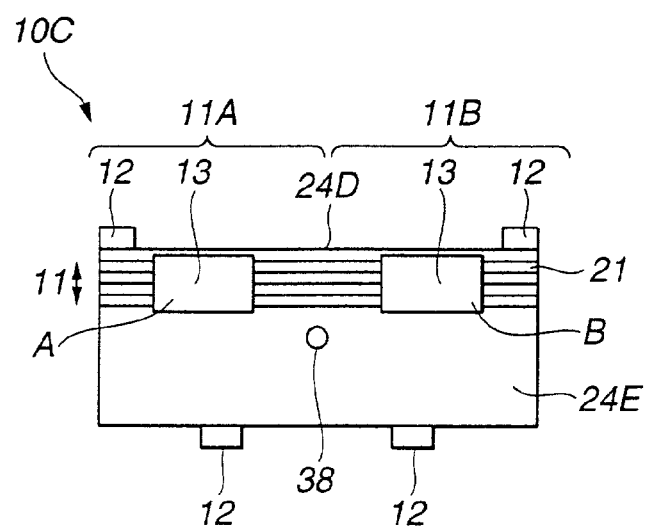
FIG. 15 illustrates an ultrasonic linear motor of a fourth embodiment according to the present invention, and is a plan view for describing a schematic configuration of an ultrasonic transducer mounted on the ultrasonic linear motor.
Figure 16:
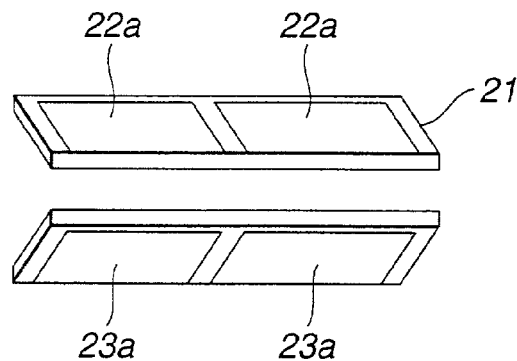
FIG. 16 is a principal component perspective view which illustrates the top and bottom faces of a piezoelectric layer of the ultrasonic transducer.
Figure 17:
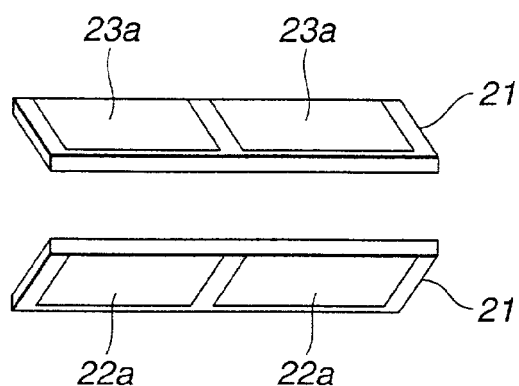
FIG. 17 is a principal component perspective view which illustrates the top and bottom faces of a piezoelectric layer of the ultrasonic transducer, which is adjacent to the piezoelectric layer shown in FIG. 16.
Figure 18:
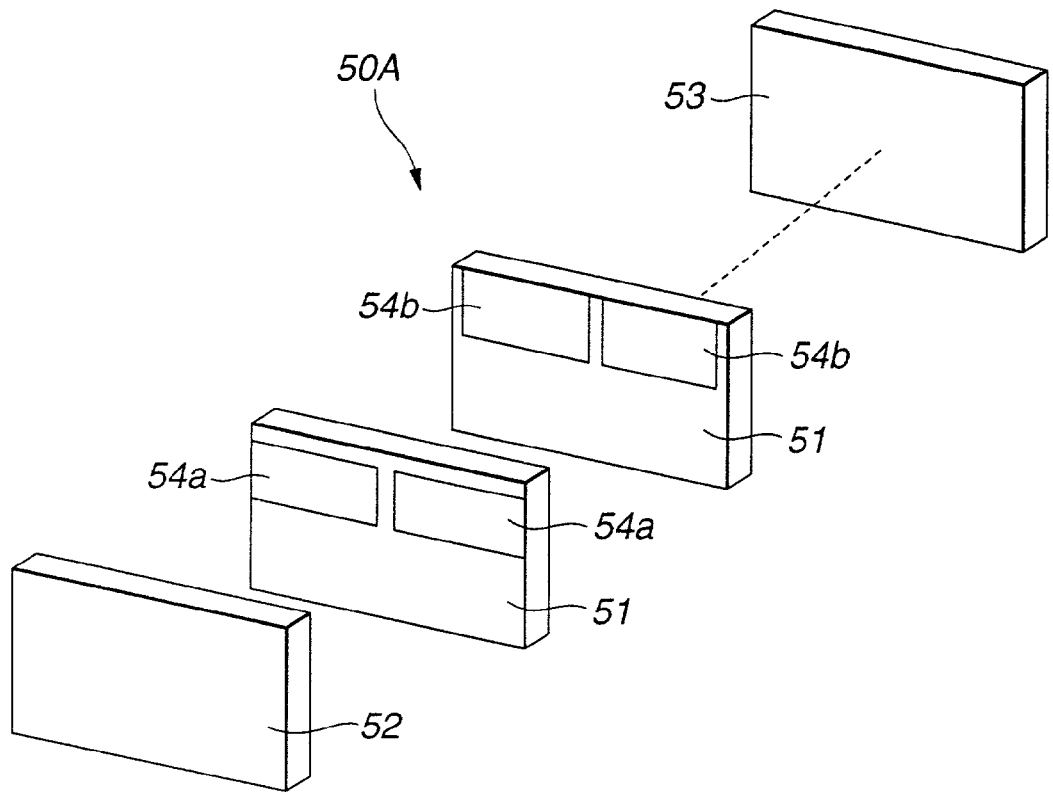
FIG. 18 is a principal component disassembled perspective view which illustrates basic components of an ultrasonic transducer employed in conventional ultrasonic linear motors.
Figure 19:
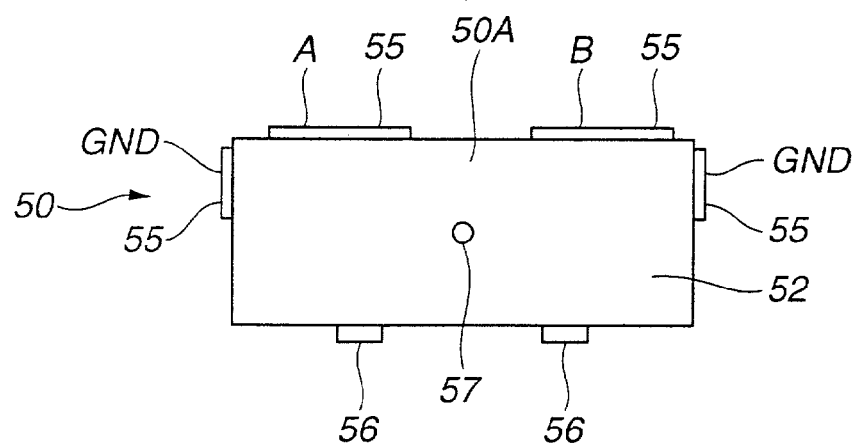
FIG. 19 is a plan view of a conventional ultrasonic transducer.
Figure 20:
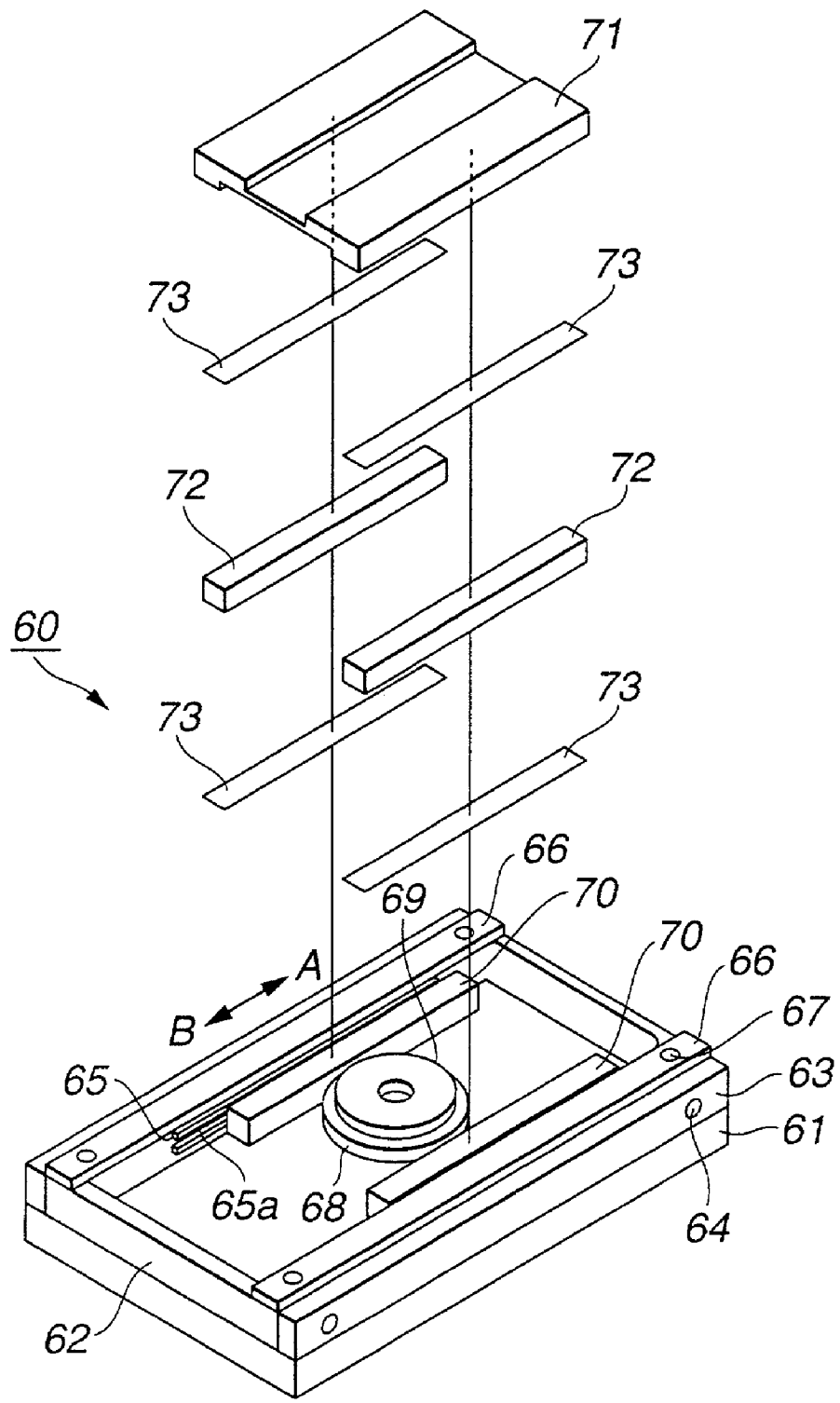
FIG. 20 is a disassembled perspective view which illustrates a schematic configuration of another conventional ultrasonic linear motor.

FIGS. 15 through 17 illustrate an ultrasonic linear motor of a fourth embodiment according to the present invention. FIG. 15 is a plan view for describing a schematic configuration of an ultrasonic transducer mounted on the ultrasonic linear motor, FIG. 16 is a principal component perspective view illustrating the top face and the bottom face of a piezoelectric layer of the aforementioned ultrasonic transducer, and FIG. 17 is a principal component perspective view illustrating the top face and the bottom face of a piezoelectric layer adjacent to the piezoelectric layer shown in FIG. 16. Note that, in FIG. 15 through FIG. 17, the same components as with the ultrasonic linear motor 30 in the above-described first embodiment are denoted by the same reference numerals, description thereof will be omitted, and description will be made regarding different components.

While an ultrasonic transducer 10C employed in an ultrasonic linear motor of the present embodiment generally has the same configuration as the first and second embodiments, the ultrasonic transducer 10C also has a different configuration wherein rectangular PZT-PMN-type piezoelectric layers 21 subjected to internal electrode processing are layered in the vertical direction (in the vertical direction of the ultrasonic transducer) so as to configure the piezoelectric layered unit 11, and two insulator layers 24D and 24E with different thickness one to another are provided so as to hold the piezoelectric layered unit 11 therebetween, as shown in FIG. 15.

The piezoelectric layer 21 is a piezoelectric device with a width of 30 mm, a depth of 4 mm, and a thickness of 100 μm, as shown in FIG. 16. The first internal electrode layer 22a on which a silver-palladium alloy film with a thickness around 10 μm has been coated as with the above-described third embodiment, is disposed on the top face (or the bottom face) of the piezoelectric layer 21 with insulator portions with a width of 1 mm on the side end portion on the back side as viewed from the front in FIG. 15, on the left and right side end portions, and on the center portion in the width direction, so as to divide the piezoelectric layer 21 into two equal parts.

On the other hand, the second internal electrode layer 23a on which a silver-palladium alloy film with a thickness around 10 μm has been coated is disposed on the face reverse of the aforementioned first internal electrode 22a of the piezoelectric layer 21 with insulator portions with a width of 1 mm on the side end portion on the front side as viewed from the front in FIG. 15, on the left and right side end portions, and on the center portion in the width direction, so as to divide the piezoelectric layer 21 into two equal parts.

As shown in the drawings, with the aforementioned first and second internal electrodes 22a and 23a, the electrode coating positions on the top face and the bottom face are reverse between piezoelectric layers 21 adjacent one to another. Around forty layers of two types of piezoelectric layers 21 on which the above-described first and second internal electrodes 22a and 23a have been formed are alternately layered (see FIGS. 16 and 17), whereby the piezoelectric layered unit 11 is configured as shown in FIG. 15.

With the ultrasonic transducer 10C according to the present embodiment, the rectangular PZT-PMN-type insulator layer 24D on the top face is an element with a width of 30 mm, a depth of 4 mm, and a thickness of 1 mm. On the other hand, the insulator layer 24E on the bottom face has dimensions of a width of 30 mm, a depth of 4 mm, and a thickness of 5 mm, and a through hole 38 with a diameter of 1 mm being provided on the top portion thereof.

Other configurations and operations are the same as the above-described first embodiment, so description will be omitted.

(Effects)

Accordingly, the present embodiment has the same advantages as with the above-described first embodiment, and also has the advantage of option in design of the ultrasonic transducer 10C increasing in manufacturing of the ultrasonic transducer 10C due to the configuration wherein the piezoelectric layers 21 are layered in the vertical direction of the ultrasonic transducer 10C (vertical direction in FIG. 15) as with the above-described third embodiment.

As described above, while description has been made regarding configurations of the ultrasonic linear motor according to the present invention and the ultrasonic transducer mounted thereon, the present invention is not intended to be restricted to the above-described first through fourth embodiments, rather, the present invention includes combinations and applications of the embodiments.

While description has been made regarding the self-moving ultrasonic transducer being driven in a straight direction in the above-described first through fourth embodiments, the transducer is not intended to be restricted to this configuration, rather, the transducer may have a configuration wherein the guides are curved with a curvature so as to drive the ultrasonic transducer along the curve corresponding to the curvature of the guides, thereby enabling an actuator moving along an arbitrary path to be realized.

Moreover, while description has been made regarding an arrangement wherein alternating voltages are applied to the piezoelectric transducers for generating elliptic vibrations in the first through fourth embodiments according to the present invention, the applied voltages are not restricted to alternating voltages, but rather, various types of voltages which can generate desired elliptic vibration may be applied. For example, DC voltages which change over time (pulse voltages) may be applied to the piezoelectric devices.

In this invention, it is apparent that various modifications different in a wide range can be made on this basis of this invention without departing from the sprit and scope of the invention. This invention is not restricted by any specific embodiment except being limited by the appended claims.

What is claimed is:

1. An ultrasonic linear motor comprising:
   first and second means for providing pressing force; and
   an ultrasonic transducer including
   piezoelectric units provided in at least two portions, including:
      a plurality of first contact portions having portions for receiving the pressing force from the first means, and
      at least one second contact portion having portions for receiving the pressing force from the second means;
   wherein voltages which change over time are applied to the piezoelectric units so as to excite the ultrasonic transducer such that elliptic vibrations are generated at least at one contact portion of the first and second contact portions, whereby the ultrasonic transducer is relatively moved as to the first or second means; and wherein contact portions are formed by at least one contact portion of the first and second contact portions for being pressed into contact against the first or second means such that the direction of relative movement between the first or second means and the ultrasonic transducer is restricted so as to move in a predetermined direction orthogonal to the direction of the pressing force.

2. An ultrasonic linear motor according to claim 1, wherein the first or second means has a groove, and faces or portions are provided on the groove for being pressed into contact against the contact portion.

3. An ultrasonic linear motor according to claim 2, wherein the groove is formed on the first or second means in a V-shape or U-shape, and the contact portion for being pressed into contact against the groove is formed in a protruding shape.

4. An ultrasonic linear motor according to claim 1, wherein at least one of the second contact portions is disposed at a position being held between a plurality of the first contact portions in the direction of relative movement of the ultrasonic transducer.

5. An ultrasonic linear motor comprising:
first and second guides for providing pressing force; and
an ultrasonic transducer including piezoelectric units provided in at least at two portions, including:
 a plurality of first contact portions having portions for receiving the pressing force from the first guide, and
 at least one second contact portion having portions for receiving the pressing force from the second guide;
wherein voltages which change over time are applied to the piezoelectric units so as to excite the ultrasonic transducer such that elliptic vibrations are generated at least at one contact portion of the first and second contact portions, so that the ultrasonic transducer is relatively moved as to the first or second guide;
wherein the ultrasonic transducer further includes an output obtaining portion which engages an object to be moved; and
wherein contact portions are formed by at least one contact portion of the first and second contact portions for being pressed into contact against the first or second guide such that the direction of relative movement between the first or second guide and the ultrasonic transducer is restricted so as to move in a predetermined direction orthogonal to the direction of the pressing force.

6. An ultrasonic linear motor according to claim 5, wherein the first or second guide has a groove, and faces or portions are provided on the groove for being pressed into contact against the contact portion.

7. An ultrasonic linear motor according to claim 6, wherein the groove is formed on the first or second guide in a V-shape or U-shape, and the contact portion for being pressed into contact against the groove is formed in a protruding shape.

8. An ultrasonic linear motor according to claim 5, wherein at least one of the second contact portions is disposed at a position being held between a plurality of the first contact portions in the direction of relative movement of the ultrasonic transducer.

9. An ultrasonic linear motor comprising:
first and second guides for providing pressing force; and
an ultrasonic transducer including piezoelectric units provided in at least at two portions, including;
 a plurality of first contact portions having portions for receiving the pressing force from the first guide, and
 at least one second contact portion having portions for receiving the pressing force from the second guide;
wherein voltages which change over time are applied to the piezoelectric units so as to excite the ultrasonic transducer such that elliptic vibrations are generated at least at one contact portion of the first and second contact portions, so that the ultrasonic transducer is relatively moved as to the first or second guide;
wherein the ultrasonic transducer further includes an output obtaining portion which engages an object to be moved; and
wherein the output obtaining portion or the holding portion is disposed at a position corresponding to a node of the flexural vibration of the ultrasonic transducer.

10. An ultrasonic linear motor according to claim 9, wherein at least one of the second contact portions is disposed at a position being held between a plurality of the first contact portions in the direction of relative movement of the ultrasonic transducer.

11. An Ultrasonic linear motor comprising:
first and second guides for providing pressing force; and
an ultrasonic transducer including
piezoelectric units provided in at least at two portions, including:
 a plurality of first contact portions having portions for receiving the pressing force from the first guide, and
 at least one second contact portion having portions for receiving the pressing force from the second guide;
wherein voltages which change over time are applied to the piezoelectric units so as to excite the ultrasonic transducer such that elliptic vibrations are generated at least at one contact portion of the first and second contact portions, so that the ultrasonic transducer is relatively moved as to the first or second guide; and
wherein contact portions are formed by at least one contact portion of the first and second contact portions for being pressed into contact against the first or second guide such that the direction of relative movement between the first or second guide and the ultrasonic transducer is restricted so as to move in a predetermined direction orthogonal to the direction of the pressing force.

12. An ultrasonic linear motor according to claim 11, wherein the first or second guide has a groove, and faces or portions are provided on the groove for being pressed into contact against the contact portion.

13. An ultrasonic linear motor according to claim 12, wherein the groove is formed on the first or second guide in a V-shape or U-shape, and the contact portion for being pressed into contact against the groove is formed in a protruding shape.

14. An ultrasonic linear motor according to claim 11, wherein at least one of the second contact portions is disposed at a position being held between a plurality of the first contact portions in the direction of relative movement of the ultrasonic transducer.

15. An ultrasonic linear motor comprising:
first and second guides for providing pressing force;
a third guide for restricting the direction of the relative movement between the first guide or the second guide and the ultrasonic transducer in a plane orthogonal to the direction of the pressing force, the relative movement being restricted in a predetermined direction orthogonal to the direction of the pressing force; and an ultrasonic transducer including piezoelectric units provided in at least at two portions, including:
a plurality of first contact portions having portions for receiving the pressing force from the first guide, and
at least one second contact portion having portions for receiving the pressing force from the second guide;
wherein voltages which change over time are applied to the piezoelectric units so as to excite the ultrasonic transducer such that elliptic vibrations are generated at least at one contact portion of the first and second contact portions, so that the ultrasonic transducer is relatively moved as to the first or second guide;
wherein the ultrasonic transducer further includes an output obtaining portion which engages an object to be moved.

16. An ultrasonic linear motor according to claim 15, wherein at least one of the second contact portions is disposed at a position being held between a plurality of the first contact portions in the direction of relative movement of the ultrasonic transducer.

* * * * *